(12) United States Patent
Nakashima et al.

(10) Patent No.: US 7,764,559 B2
(45) Date of Patent: Jul. 27, 2010

(54) SEMICONDUCTOR MEMORY DEVICE, REFRESH CONTROL METHOD THEREOF, AND TEST METHOD THEREOF

(75) Inventors: Masami Nakashima, Kasugai (JP); Yoshiharu Kato, Kasugai (JP); Kazufumi Komura, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 2 days.

(21) Appl. No.: 11/715,452

(22) Filed: Mar. 8, 2007

(65) Prior Publication Data
US 2007/0159906 A1 Jul. 12, 2007

Related U.S. Application Data

(62) Division of application No. 11/249,454, filed on Oct. 14, 2005, now Pat. No. 7,206,246, which is a division of application No. 10/261,510, filed on Oct. 2, 2002, now abandoned.

(30) Foreign Application Priority Data
Feb. 25, 2002 (JP) ............... 2002-047464

(51) Int. Cl.
*G11C 7/00* (2006.01)
(52) U.S. Cl. .................. 365/222; 365/233.1
(58) Field of Classification Search .......... 365/222, 365/233.1
See application file for complete search history.

(56) References Cited

U.S. PATENT DOCUMENTS

| | | | |
|---|---|---|---|
| 5,210,717 A | 5/1993 | Tamaki | |
| 5,404,335 A | 4/1995 | Tobita | |
| 5,511,176 A | 4/1996 | Tsuha | |
| 5,614,685 A | 3/1997 | Matsumoto et al. | |
| 5,623,451 A * | 4/1997 | Kawagoe | 365/222 |
| 6,229,752 B1 | 5/2001 | Ayukawa et al. | |
| 6,298,000 B1 | 10/2001 | Kitade et al. | |
| 6,408,356 B1 | 6/2002 | Dell | |
| 6,646,943 B2 | 11/2003 | Kim | |

FOREIGN PATENT DOCUMENTS

| | | |
|---|---|---|
| JP | 59-042692 | 3/1984 |
| JP | 01-118292 | 5/1989 |
| JP | 01-125796 | 5/1989 |
| JP | 01-237996 | 9/1989 |
| JP | 04-178993 A | 6/1992 |

(Continued)

*Primary Examiner*—Hoai V Ho
(74) *Attorney, Agent, or Firm*—Arent Fox LLP

(57) ABSTRACT

The present invention provides a semiconductor memory device which reduces current consumption in a standby state owing to a suitable refresh-thinning-out function, and a refresh control method thereof. When the refresh-thinning-out function is added while a refresh operation and an external access operation are being executed independently of each other, a refresh address counter outputs a refresh address Add(C) and inputs predetermined high-order bits thereof to a refresh-thinning-out control as a high-order refresh address Add(C) (m), where judgment as to whether the refresh operation is performed, is made. A refresh permission signal RFEN corresponding to the result of judgment is inputted to a word driver to activate and control the word driver. The process of judgment by the refresh-thinning-out control circuit can be embedded in an access time of a row system.

3 Claims, 23 Drawing Sheets

CIRCUIT BLOCK DIAGRAM OF FIRST EMBODIMENT

FOREIGN PATENT DOCUMENTS

| | | |
|---|---|---|
| JP | 05-006663 | 1/1993 |
| JP | 05-054648 | 3/1993 |
| JP | 05-109268 | 4/1993 |
| JP | 05-159571 A | 6/1993 |
| JP | 05-189959 | 7/1993 |
| JP | 05-198172 | 8/1993 |
| JP | 05-217368 | 8/1993 |
| JP | 05-266657 | 10/1993 |
| JP | 06-089571 | 3/1994 |
| JP | 06-103767 | 4/1994 |
| JP | 06-259961 | 9/1994 |
| JP | 07-093971 A | 4/1995 |
| JP | 07-169268 A | 7/1995 |
| JP | 07-244988 | 9/1995 |
| JP | 08-138373 | 5/1996 |
| JP | 08-279733 | 10/1996 |
| JP | 09-063266 | 3/1997 |
| JP | 09-073777 | 3/1997 |
| JP | 09-102193 | 4/1997 |
| JP | 09-231748 | 9/1997 |
| JP | 2000-021162 A | 1/2000 |
| JP | 2001-256778 A | 9/2001 |

* cited by examiner

FIG. 1 CIRCUIT BLOCK DIAGRAM OF FIRST EMBODIMENT

EXAMPLE OF INPUT OF ADDRESS TO REFRESH-THINNING-OUT CONTROL CIRCUIT EMPLOYED IN FIRST EMBODIMENT

FIG. 3 EXAMPLE OF LAYOUT ARRANGEMENT SUITABLE FOR BEING EQUIPPED WITH DEDICATED ADDRESS DECODER

FIG. 4 CIRCUIT BLOCK DIAGRAM OF SECOND EMBODIMENT

EXAMPLE OF INPUT OF ADDRESS TO REFRESH-THINNING-OUT CONTROL CIRCUIT EMPLOYED IN SECOND EMBODIMENT

FIG. 6 EXAMPLE OF LAYOUT ARRANGEMENT SUITABLE FOR BEING EQUIPPED WITH BUFFER SECTION

FIG. 7 OPERATIONAL WAVEFORMS SHOWING ACCESS COMPETITION IN PSEUDO SRAM

FIG. 8  OPERATIONAL WAVEFORMS OF BURST LENGTH 1 IN PSEUDO SSRAM (NORMAL OPERATION)

FIG. 9 OPERATIONAL WAVEFORMS OF BURST LENGTH 1 IN PSEUDO SSRAM (FIRST EMBODIMENT-(1) AND SECOND EMBODIMENT)

FIG. 10 OPERATIONAL WAVEFORMS OF MULTI-BURST LENGTH IN PSEUDO SSRAM (NORMAL OPERATION)

FIG. 11 OPERATIONAL WAVEFORMS OF MULTI-BURST LENGTH IN PSEUDO SSRAM (FIRST EMBODIMENT-(1) AND SECOND EMBODIMENT)

FIG. 12  REFRESH-THINNING-OUT CONTROL CIRCUIT (THIRD EMBODIMENT)

FIG. 13 SWITCHING SECTION EMPLOYED IN THIRD EMBODIMENT

DEDICATED ADDRESS DECODER EMPLOYED IN THIRD EMBODIMENT

FIG. 15  REFRESH-ABILITY RECORDER SECTION EMPLOYED IN THIRD EMBODIMENT

FIRST JUDGMENT SECTION EMPLOYED IN THIRD EMBODIMENT

OPERATIONAL WAVEFORMS OF REFRESH-ABILITY RECORDER SECTION AND FIRST JUDGMENT SECTION

FIG. 18
SECOND JUDGMENT SECTION EMPLOYED IN THIRD EMBODIMENT
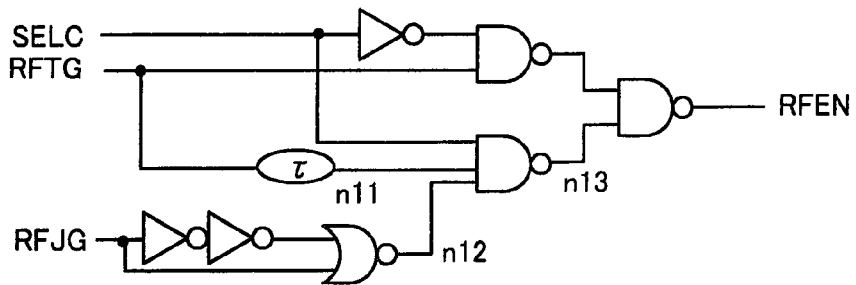
FIG. 19
OPERATIONAL WAVEFORMS OF SECOND JUDGMENT SECTION
(A) IN CASE (A0,B0) ARE SELECTED
(IN CASE DATA-HOLDING CHARACTERISTIC IS RELATIVELY GOOD)
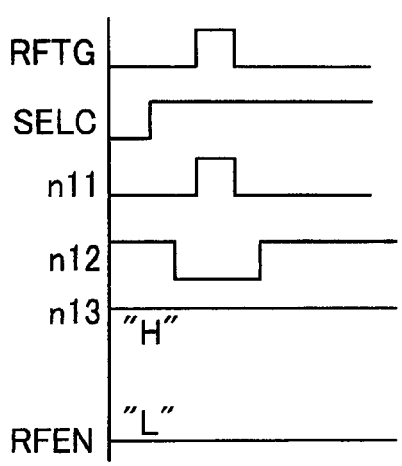
(B) IN CASE (A1,B0)~(A3,B3) ARE SELECTED
(IN CASE DATA-HOLDING CHARACTERISTIC IS RELATIVELY BAD)
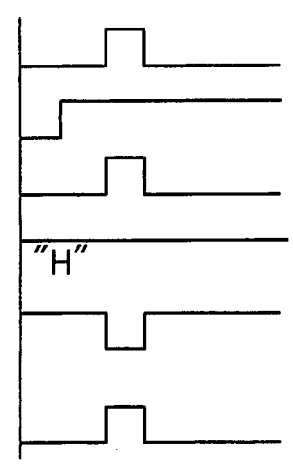

REFRESH-THINNING-OUT CIRCUIT EQUIPPED WITH TEST FACILITATING FUNCTION (FOURTH EMBODIMENT)

FLOW CHART SHOWING FIRST SPECIFIC EXAMPLE OF REFRESH-THINNING-OUT CONTROL (FIFTH EMBODIMENT) IN REDUNDANT REGION

CIRCUIT BLOCK DIAGRAM ILLUSTRATING SECOND SPECIFIC EXAMPLE OF REFRESH-THINNING-OUT CONTROL (FIFTH EMBODIMENT) IN REDUNDANT REGION

FIG. 23 LAYOUT CONCEPTUAL DIAGRAM DEPICTING COLUMN REDUNDANT CONFIGURATIONS DIVIDED INTO BLOCKS AS VIEWED IN ROW ADDRESS DIRECTION

FIG. 24 PRIOR ART    CIRCUIT BLOCK DIAGRAM OF PRIOR ART

REFRESH-THINNING-OUT CONTROL CIRCUIT EMPLOYED IN PRIOR ART

SEMICONDUCTOR MEMORY DEVICE, REFRESH CONTROL METHOD THEREOF, AND TEST METHOD THEREOF

CROSS-REFERENCE TO RELATED APPLICATION

This is a divisional application, which claims the benefit of pending U.S. patent application Ser. No. 11/249,454, now U.S. Pat. No. 7,206,246, filed Oct. 14, 2005, which in turn is a divisional application of U.S. patent application Ser. No. 10/261,510, filed Oct. 2, 2002 now abandoned. The disclosures of the prior applications are hereby incorporated herewith in their entirety by reference.

BACKGROUND OF THE INVENTION

1. Field of the Invention

The present invention relates to a refresh control method of a semiconductor memory device, and particularly to a reduction in current consumption in a standby state.

2. Description of the Related Art

A semiconductor memory device requiring a refresh operation must perform a refresh operation on a regular basis even in a standby state in which a low current consumption operation is required. A reduction in current consumption at the refresh operation is essential.

In memory cells installed in a semiconductor memory device in general, each of characteristics for holding data stored therein has some width. Therefore, a refresh cycle tREF equivalent to a time interval in which the same memory cells are refreshed, must be set to a value worst in data-holding characteristics. However, it is enough for memory cells each having more excellent data-holding characteristics if the refresh operation is performed in a cycle longer than the set refresh cycle tREF. Therefore, there has been proposed a so-called refresh-thinning-out operation in which one refresh operation is effected on each of memory cells each having satisfactory data-holding characteristics every 2 cycles or more of the refresh cycle tREF. Thus, the number of refresh operations per predetermined time can be reduced and current consumption at the refresh operation can be reduced.

A semiconductor memory device having a refresh-thinning-out function has been disclosed in Japanese Laid-Open Patent publication No. 9-102193. FIG. 24 mainly shows a circuit configuration of a row address system. The same figure shows, as an example, a case in which a /CAS before/RAS (hereinafter abbreviated as "CBR") refresh operation is provided with a refresh-thinning-out function.

A timing circuit 131 outputs a trigger signal corresponding to an activation signal φR for activating a row address decoder 137 with predetermined timing according to a control signal supplied to a control terminal 101. This trigger signal is inputted to an AND logic gate 400b. Further, the timing circuit 131 outputs an activation signal φ1 for activating a refresh-thinning-out control circuit 105 to be described later.

A row address buffer 132 latches an address signal supplied to address terminal 101 at a fall time of a control signal /RAS and supplies the latched address signal to an address selector 135 as row address Add(O).

A CBR judgment circuit 133 outputs a refresh command signal φCBR according to the execution of the setting of a CBR refresh mode.

A CBR counter 134 counts the falling edge of the refresh command signal φCBR and outputs refresh address Add(C) to an address selector 135.

The address selector 135 is controlled by the refresh command signal φCBR to couple or link the row address buffer 132 and the row address decoder 137 upon read and write operations and couple the CBR counter 134 and the row address decoder 137 upon the refresh operation.

The refresh-thinning-out control circuit 105 activated by the activation signal φ1 is inputted with the refresh address Add(C) outputted from the CBR counter 134 and judges whether the address Add(C) is a registered address. The refresh-thinning-out control circuit 105 outputs a refresh permission signal φ2 to the other input terminal of the AND logic gate 400b according to the result of judgment to control the output of the activation signal φR.

The row address decoder 137 is activated by the activation signal φR to thereby allow a word driver 104 to activate any one of a plurality of word lines (WL0 through WLn) in a memory-cell array 140 according to the row address Add(O) or refresh address Add(C) inputted via the address selector 135.

Namely, since a control signal /RAS falls ahead of a control signal /CAS in a normal write/read cycle, an output signal φCBR of the CBR judgment circuit 133 is held at a deactivation level. Therefore, the address selector 135 outputs row address Add(O) outputted from the row address buffer 132 to the row address decoder 137. Thereafter, the row address decoder 137 is activated by an activation signal φR produced by the timing circuit 131 to thereby activate the corresponding word line corresponding to the write/read cycle.

Since the control signal /CAS falls ahead of the control signal /RAS in a CBR refresh cycle, the output signal φCBR of the CBR judgment circuit 133 is brought to an activation level. Therefore, the address selector 135 outputs refresh address Add(C) outputted from the CBR counter 134 to the row address decoder 137. When the refresh address Add(C) and its corresponding registered address coincide with each other at this time, a permission signal φ2 is activated and an activation signal φR is supplied to the row address decoder 137, so that a word line corresponding to the refresh address Add(C) is activated. When they are found not to coincide with each other, the activation signal φR is masked so that no word line is activated.

FIG. 25 shows a circuit diagram of the refresh-thinning-out control circuit 105 with being taken as the center. n+1 bit internal address signals A0'-An' and their inverted signals /A0'-/An', which constitute refresh address Add(C) outputted from a CBR counter 134, are inputted to address registration circuits 1.1-1.r.

The address registration circuits 1.1-1.r are respectively provided with an NMOS transistor 600, and fuses 7.0-7.n and NMOS transistors 8.0-8.n, and fuses 7.0'-7.n' and NMOS transistors 8.0'-8.n' respectively provided in association with the address signals A0'-An' and their inverted signals /A0'-/An'.

When the refresh address Add(C) coincides with any of addresses registered in the address registration circuits 1.1-1.r, a signal corresponding to any of outputs φH1-φHr of the address registration circuits 1.1-1.r is brought to a high level, and hence a refresh permission signal φ2 is rendered high in level.

As a result of an increase in the function required for a portable device with the popularization thereof, there has recently been a further demand for a large-capacity memory as an alternative to the conventionally-mounted static random access memory (hereinafter called "SRAM"). Since it is necessary to package or mount the memory in a limited space at the actual price, a refresh-function built-in DRAM so called pseudo SRRAM, having built in control related to a refresh operation peculiar to a memory cell such as a DRAM has been used while each memory cell for a dynamic random access memory (hereinafter called "DRAM") formed in high integration and low in bit unit price is being used as an alternative to each memory cell of the SRAM. Thus, an external controller controls the operation for performing a self-refresh command or for conducting self-refresh operation during an external access-free period then, pseudo SRAM has been equipped with a so-called self-refresh mode in which control or the like on each refresh address is preformed. In reply to a future's high-speed demand, specs of a so-called pseudo SSRAM adapted to external specs of a synchronous SRAM (hereinafter called "SSRAM") are becoming a reality.

However, the semiconductor memory device having the refresh-thinning-out function, which has been illustrated in Japanese Laid-open Patent Publication No. 9-102193, needs to register row addresses requiring the execution of refresh every refresh cycle tREF through the use of the address registration circuits 1.1-1.r and requires the address registration circuits 1.1-1.r every row address. Further, the respective address registration circuits 1.1-1.r respectively need fuses corresponding to bit widths of the row address. Namely, the total number of fuses to be mounted in the semiconductor memory device needs (bit widths of row address)×(number of row addresses to perform refresh every cycle). In order to obtain an effective reduction effect of current consumption by the refresh operation with respect to the distribution of data-holding characteristics in the semiconductor memory device, a large number of fuses must be provided and an increase in die size of the semiconductor memory device might be incurred, thus resulting in a problem.

Since a large number of fuses are cut when the corresponding addresses are registered in the address registration circuits 1.1-1.r, much test time is needed. It is further assumed that since the refresh address Add(C) is generated by the built-in counter, external control is restricted, and much test time is required upon execution of a functional test even in the case of, for example, the setting of refresh-thinning-out control on each redundant region for substituting a characteristic defective cell with another, thus causing a problem.

Since the refresh address Add(C) is connected even to the refresh-thinning-out control circuit 105 as well as to the row address buffer 137, the CBR counter 134 must drive these loads, thus being in danger of causing an increase in drive current. Since the refresh-thinning-out control circuit 105 takes such a configuration as to always make a comparison between the refresh address Add(C) and each registered address regardless of judgment as to execution/non-execution of the refresh operation, unnecessary currents consumed will flow even during a judgment operation-free period. A problem arises in that this is danger of being unable to meet the demand for low current consumption due to these currents consumed. Since the current consumption is originally low upon standby in particular, the rate of an operating current of the refresh-thinning-out control circuit 105 to the total current consumption becomes large, thus resulting in a problem for the reduction in current consumption.

While the load on the external controller for the refresh operation has heretofore been significantly lightened in the semiconductor memory device called the pseudo SRAM or pseudo SSRAM, there is still a need to perform its control by the external controller. There may be a case in which it is necessary to provide a dedicated control terminal upon its control. Therefore, it is hard to say that the conventional pseudo SRAM or the like has the perfect compatibility with an SRAM or SSRAM in which such control or a dedicated control terminal is unnecessary. To this end, there has been proposed a semiconductor memory device having such specs that in order to bring the compatibility near to the perfect one, a refresh operation and a normal read/write operation are executed independently of each other with occasional timing while the refresh operation is being incorporated therein as an internal access operation. However, the semiconductor memory device is accompanied by a problem that when a refresh-thinning-out function is added thereto, a refresh operating time might be long due to the time required to make a decision as to refresh address by a refresh-thinning-out control, and a delay in propagation due to a load imposed on the refresh address on a signal path, thus causing a possibility that an operational cycle time will become long.

SUMMARY OF THE INVENTION

The present invention has been made to solve at least one of the problems of the prior art. It is therefore a main object of the present invention to provide a semiconductor memory device which is capable of achieving a further reduction in current consumption insufficient for the conventional semiconductor memory device and is free of incurring of an operational increase in delay even if applied to a pseudo SRAM or the like having high compatibility and which is capable of realizing a suitable refresh-thinning-out function to thereby reduce current consumption in a standby state, and a refresh control method of the semiconductor memory device.

In order to achieve the above object, a semiconductor memory device according to a first aspect of the present invention comprises, when target word lines are sequentially selected according to refresh request signals to thereby perform refresh operations, a designator section for designating a corresponding address group related to a word line group to be intended for the refresh operation, based on a plurality of the refresh request signals, a storage section for storing in advance a predetermined address group related to a predetermined word line group including word lines connected with memory cells having predetermined data-holding characteristics, a comparator section for comparing the corresponding address group designated by the designator section and the predetermined address group stored in the storage section, and a judgment section for judging whether the refresh operation is executable, according to the result of comparison.

In the semiconductor memory device according to the first aspect of the present invention, the comparator section compares the corresponding address group designated by the designator section and related to the target word line group according to the plurality of refresh request signals, and the predetermined address group stored in the storage section and related to the predetermined word line group including the word lines connected with the memory cells each having the predetermined data-holding characteristics. The judgment section judges whether the refresh operation for the corresponding address group is executable, according to the result of comparison.

Further, a refresh control method of the semiconductor memory device according to the first aspect of the present invention comprises a step of sequentially selecting target word lines according to refresh request signals to thereby perform refresh operations, and a step of judging whether a refresh operation is executable, according to data-holding characteristics stored in each of memory cells connected to a word line group, for each corresponding address group related to a word line group to be intended for the refresh operation in response to a plurality of refresh request signals.

Thus, a fuse, a ROM, a RAM and the like provided to be stored in the storage section may be provided for each corresponding address group. As compared with the case in which they are provided every addresses related to target word lines according to refresh request signals, the exclusively possessed area of the storage section to a die size of a semiconductor memory device can be reduced.

Since the units of judgment as to execution/non-execution of the refresh operations are collected up for each corresponding address group, the refresh-operation execution judgment might be made inclusive of word lines each free of the need for execution of the refresh operation. Upon the setting of making a decision as to its execution/non-execution for each individual word line in reverse, there is a need to provide storage sections every addresses related to the word lines, and hence the exclusively possessed area of each storage section will increase. Namely, the exclusively possessed area of the storage section and a reduction in current consumption by refresh-thinning-out has a contradictory relationship. By adjusting the number of occurrences of refresh request signals collected up with the corresponding address group, the reduction in current consumption by the refresh-thinning-out operation can be realized while the increase in the exclusively possessed area of the storage section is being suppressed.

A semiconductor memory device according to a second aspect of the present invention comprises, when target word lines are sequentially selected according to refresh request signals to thereby perform refresh operations, a refresh-thinning-out controller section including a designator section for designating a corresponding address related to a word line intended for the refresh operation according to each of the refresh request signals, and a judgment section for comparing each corresponding address and a predetermined address related to a predetermined word line connected with one of memory cells each having predetermined data-holding characteristics and judging whether the refresh operation is executable, according to the result of comparison, and a switching section for switching an active state of the refresh-thinning-out controller section under predetermined conditions, wherein when the refresh-thinning-out controller section is defunctionalized, the switching section deactivates at least either one of the designator section or the judgment section.

Thus, since at least either the designator section or the judgment section is deactivated where no refresh-thinning-out operation is carried out, current consumption due to an unnecessary circuit operation can be reduced.

A semiconductor memory device according to a third aspect of the present invention comprises, when target word lines are sequentially selected according to refresh request signals to thereby perform refresh operations, a storage section for storing each of predetermined addresses each compared with a corresponding address related to each word line intended for the refresh operation, a storage switching section for switching each of the predetermined addresses to be stored in the storage section between addresses at which memory cells each having first data-holding characteristics are included, and addresses at which memory cells each having second data-holding characteristics are included, according to a distribution of data-holding characteristics included in memory cells, and a judgment section for switching the result of judgment as to execution/non-execution of the refresh operation according to the switching of the storage switching section.

In the semiconductor memory device according to the third aspect of the present invention, the storage switching section switches each of the predetermined addresses to be stored in the storage section between the addresses including the memory cells having their data-holding characteristics corresponding to the first and second data-holding characteristics according to the distribution of the data-holding characteristics of the memory cells in the semiconductor memory device, and performs switching to the result of judgment as to execution/non-execution made by the judgment section.

Thus, since each of the predetermined addresses to be stored in the storage section is switched according to the distribution of the data-holding characteristics stored in the memory cells in the semiconductor memory device and the switching to the result of judgment as to the execution/non-execution of the refresh operation can be performed. Therefore, the predetermined addresses can be switched according to the distribution of the data-holding characteristics so that the number of predetermined addresses to be stored in the storage section is reduced. The layout number of fuses, ROMs, RAMs or the like to be provided for the storage section is compressed to make it possible to suppress an increase in the die size of the semiconductor memory device.

Since the number of the predetermined addresses to be stored is compressed, the procedure of storing the predetermined addresses to the storage section can be lightened. The shortening of a processing time and a reduction in processing cost with its shortening can be achieved.

Here, a refresh cycle tREF is determined according to the ability of data-holding characteristics of each memory cell. Namely, there is a need to effect a refresh operation on each memory cell relatively poor in data-holding characteristics in a shorter period of time. Since the refresh cycle tREF is set under rate-control to each memory cell poor in data-holding characteristics, a decision as to the execution/non-execution of the refresh operation is made to each memory cell relatively good in data-holding characteristics according to each of refresh request signals, and the refresh operation may be effected thereon as needed. On the other hand, there is a need to effect the refresh operation on each memory cell relatively poor in data-holding characteristics for each refresh request signal.

A semiconductor memory device according to a fourth aspect of the present invention comprises a refresh-thinning-out controller section for comparing a corresponding address related to each of the target word lines and each of predetermined addresses related to predetermined word lines connected with memory cells each having predetermined data-holding characteristics and judging whether the refresh operation is executable, according to the result of comparison, and an output section activated upon testing and for outputting the result of judgment from the refresh-thinning-out controller section to the outside.

In the semiconductor memory device according to the fourth aspect of the present invention, the output section is activated upon testing to output the result of judgment sent from the refresh-thinning-out controller section to the outside.

Thus, the result of judgment as to the execution/non-execution of the refresh operation by the refresh-thinning-out controller section can be observed externally as needed. It can be made available for a fail analysis, a characteristic examination and the like of the semiconductor memory device, and a characteristic test can be executed efficiently.

A semiconductor memory device according to a fifth aspect of the present invention comprises a refresh-thinning-out controller section for comparing each of corresponding addresses related to each of the target word lines and each of predetermined addresses related to predetermined word lines connected with memory cells each having predetermined data-holding characteristics and judging whether the refresh operation is executable, according to the result of comparison, and redundant memory cells for relieving defective memory cells, wherein of the corresponding addresses, redundant addresses in which redundancy setting for the redundant memory cells has been performed, are not judged by the refresh-thinning-out controller section.

In the semiconductor memory device according to the fifth aspect of the present invention, when the corresponding addresses are redundancy-set to their corresponding redundant addresses to relieve the defective memory cells by the redundant memory cells, the redundant addresses are not judged by the refresh-thinning-out controller section.

A refresh control method of the semiconductor memory device according to the fifth aspect of the present invention comprises a step of sequentially selecting target word lines according to refresh request signals to thereby perform refresh operations, and a step of avoiding judgment as to execution/non-execution of the refresh operation with respect to redundant addresses subject to redundancy setting, of corresponding addresses related to the target word lines.

Thus, since the judgment as to the execution/non-execution of the refresh operations is not effected on the redundancy-set redundant memory cells, the test of measuring data-holding characteristics for each of the redundant memory cells and selecting a predetermined address for performing refresh-thinning-out control, from within redundant addresses as needed becomes unnecessary. An increase in test time can be suppressed.

A semiconductor memory device according to a sixth aspect of the present invention, wherein an external access operation executed based on each of external-access request signals and a refresh operation executed based on each of refresh request signals produced automatically thereinside are executed independently of each other, comprises an arbiter section for making arbitration to the external-access request signal and the refresh request signal, a controller section for controlling decode processing of each corresponding address with respect to either the external access operation or the refresh operation determined by the arbiter section, a word line driver section for driving a row address decoder for the corresponding address, which is started up by the controller section, and each word line selected by the row address decoder; and a refresh-thinning-out controller section for making a decision as to execution/non-execution of the refresh operation with respect to the corresponding address outputted according to the refresh request signal, wherein the row address decoder or the word line driver section is activated and controlled based on the result of determination by the refresh-thinning-out controller section.

In the semiconductor memory device according to the sixth aspect of the present invention, the arbiter section arbitrates the external-access request signal and the refresh request signal to thereby determine either one of the external access operation and the refresh operation. Next, the decode processing is started under control made from the controller section with respect to the determined operation. Thus, a series of operations from the decode processing of each corresponding address by the row address decoder to the driving process of each word line selected by the word line driver section are advanced or put forward. In parallel with this series of operations, the refresh-thinning-out controller section makes a refresh-operation execution/non-execution decision as to each corresponding address outputted according to the corresponding refresh request signal and thereby activates and controls the row address decoder or the word line driver section according to the result of decision referred to above.

A refresh control method of the semiconductor memory device according to the sixth aspect of the present invention comprises a step of executing an external access operation based on each of external-access request signals and a refresh operation based on each of refresh request signals produced automatically thereinside, the external operation and the refresh operation being executed independently of each other, a step of selecting the refresh operation according to arbitration to the external-access request signal and the refresh request signal and performing a judgment process as to execution/non-execution of the refresh operation relative to the corresponding address in parallel with a word line driving process made following a decode process of the corresponding address intended for the refresh operation, and a step of activating and controlling the decode process or the word line driving process, based on the result of judgment as to the execution/non-execution thereof.

In the refresh control method of the semiconductor memory device according to the sixth aspect of the present invention, when the refresh operation is selected according to the refresh request signal, the process of judging whether the refresh operation is executable, is carried out in parallel with the decode process of the corresponding address and the word line driving process made following the decode process. The decode process or the word line driving process is activated and controlled according to the result of judgment.

Thus, since the process of judging whether the refresh operation is executable, is embedded in the time required for the process of decoding the corresponding address and for the word line driving process, the time required to discriminate whether the refresh operation is executable, is not added to an operating time including the refresh operation, so that an increase in operating time is avoided.

A semiconductor memory device according to a seventh aspect of the present invention, wherein an external access operation executed based on each of external-access request signals and a refresh operation executed based on each of refresh request signals produced automatically thereinside are executed independently of each other comprises an arbiter section for making arbitration to the external-access request signal and the refresh request signal, a refresh request section for outputting the refresh request signal to the arbiter section, and a refresh-thinning-out controller section for making judgment as to execution/non-execution of the refresh operation with respect to a corresponding address outputted according to the refresh request signal, wherein the refresh request section is controlled based on the result of judgment by the refresh-thinning-out controller section.

In the semiconductor memory device according to the seventh aspect of the present invention, the refresh-thinning-out controller section judges whether the refresh operation is executable, with respect to each corresponding address outputted according to the refresh request signal and controls the refresh request section based on the result of judgment. When the refresh request signal is outputted from the refresh request section, the arbiter section makes arbitration between the refresh request signal and the external access request signal, so that either one of the external access operation and the refresh operation is determined.

A refresh control method of the semiconductor memory device according to the seventh aspect of the present invention comprises a step of executing an external access operation based on each of external-access request signals and a refresh operation based on each of refresh request signals produced automatically thereinside, the external operation and the refresh operation being executed independently of each other, a step of judging whether the refresh operation is executable, with respect to each corresponding address outputted according to the refresh request signal, and a step of arbitrating the refresh request signal and the external-access request signal based on the result of judgment.

In the refresh control method of the semiconductor memory device according to the seventh aspect of the present invention, judgment as to whether the refresh operation is executable, is made to each corresponding address outputted according to the refresh request signal, and the refresh request signal is set as an arbitration signal, based on the result of judgment, whereby an arbitration is made between the refresh request signal and the external-access request signal.

Thus, since the refresh request signal is not set as the arbitration signal at a stage prior to the judgment as to the execution/non-execution of the refresh operation, the external access operation is immediately performed if the external-access request signal is produced during the process of judgment as to the execution/non-execution thereof. The time required to discriminate whether the refresh operation is executable, is not added as a delay in external access operation.

When judgment for prohibiting the refresh operation is made to the refresh request signal, the refresh request signal is not made available for arbitrations between the external-access request signal and the same. Namely, when the refresh operation is judged to be prohibited, the decode process of the corresponding address subsequent to the arbitrations between the request signals is not executed, and unnecessary circuit operations are stopped to make it possible to reduce current consumption.

A test method of a semiconductor memory device according to another aspect of the present invention, wherein refresh operations are performed according to judgment as to execution/non-execution of the refresh operations every refresh request signals while performing redundancy setting, comprises a redundant address acquiring step for acquiring each redundant address to be subjected to the redundancy setting, a predetermined address acquiring step for acquiring predetermined addresses related to memory cells each having predetermined data-holding characteristics, and a storing step for storing the redundant addresses and the predetermined addresses in the semiconductor memory device in advance to exclude the two from an object for the judgment as to the execution/non-execution of the refresh operation.

In the test method of the semiconductor memory device according to another aspect of the present invention, the redundant addresses acquired by the redundant address acquiring step are stored in the semiconductor memory device in advance in addition to the predetermined addresses and excluded from the object for the judgment as to the execution/non-execution of the refresh operation.

Thus, the predetermined addresses each having predetermined data-holding characteristics and not subjected to the judgment as to the execution/non-execution of the refresh operation, and the redundant addresses can be both stored. The redundant addresses can be subjected to settings free of the judgment as to whether the refresh operation is executable.

The test of measuring data-holding characteristics of a memory cell corresponding to each redundant address, and selecting a predetermined address for making refresh operation execution/non-execution judgment, of the redundant addresses as needed, becomes unnecessary. An increase in test time can be suppressed.

The above and further objections and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 18 is a circuit block diagram depicting a second judgment section employed in the third embodiment;

FIG. 19 is an operation waveform diagram showing the operation of the second judgment section;

DETAILED DESCRIPTION OF THE PREFERRED EMBODIMENTS

First through fifth embodiments illustrative of embodied ones of a semiconductor memory device of the present invention and a refresh control method of the semiconductor memory device will hereinafter be described in detail based on FIGS. 1 through 23 while referring to these drawings.

Figure 1:
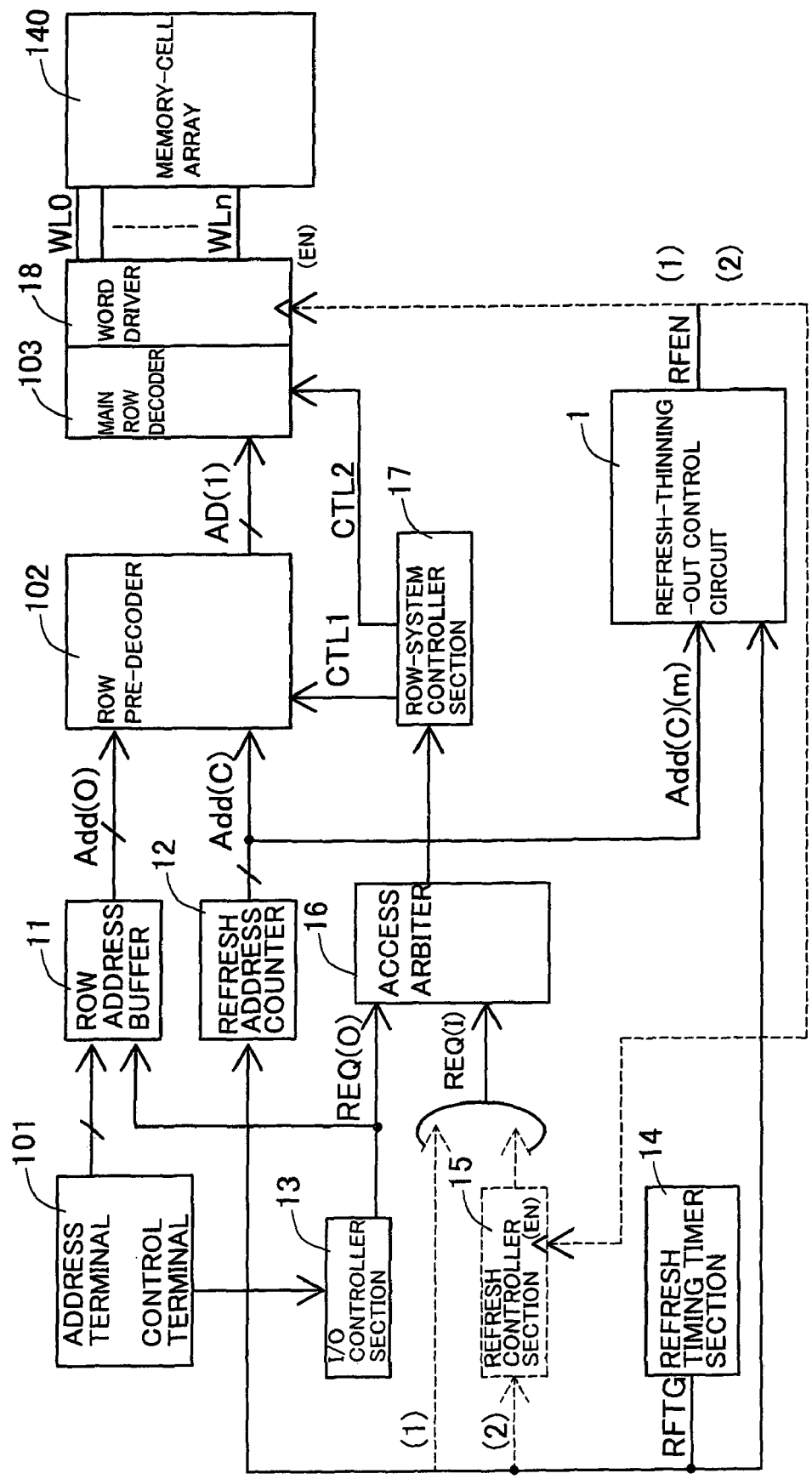
FIG. 1 is a circuit block diagram of a semiconductor memory device according to a first embodiment.

The first embodiment shown in FIG. 1 shows a semiconductor memory device wherein a refresh-thinning-out function is added to operation specs in which a built-in refresh operation and an external access operation are activated independently of each other with occasional timings. The present embodiment is a semiconductor memory device wherein since the refresh operation and the external access operation can be performed independently of each other, an external controller used for the refresh operation becomes unnecessary, and a refresh-thinning-out function is provided after compatibility of a pseudo SRAM or a pseudo SSRAM to an SRAM or an SSRAM has been made more complete, whereby even a reduction in current consumption at standby can be achieved. Incidentally, FIG. 1 shows only a section related to a row address-system.

A predetermined control terminal 101 is connected to an I/O controller section 13, which outputs an external-access request signal REQ (O) in response to a control signal inputted from the control terminal 101. Together with address signals inputted from address terminals 101 with a predetermined number of bits, the external-access request signal REQ (O) is connected to a row address buffer 11, which outputs row address Add(O) to a row pre-decoder 102.

A refresh trigger signal RFTG outputted from a built-in refresh timing timer section 14 for each predetermined time is inputted to a refresh address counter 12 and a refresh controller section 15 from which a refresh request signal REQ(I) is outputted (in the case of a control method (2) to be described later). In the case of a control method (1) to be described later, the refresh trigger signal RFTG serves as the refresh request signal REQ(I). The refresh address counter 12 inputs refresh address Add(C) to the row pre-decoder 102 and inputs predetermined high-order bits of the refresh address Add(C) to a refresh-thinning-out control circuit 1 as high-order refresh address Add(C) (m).

The external-access request signal REQ(O) outputted from the I/O controller section 13 and the refresh trigger signal RFTG (in the case of the control method (1) to be described later) or the refresh request signal REQ(I) are inputted to an access arbiter 16. The access arbiter 16 detects level transitions of the request signals each inputted as a level signal or a pulse signal, thereby being capable of detecting a signal front and end between the request signals. When the pulse signal is needed, the provision of a circuit for generating a pulse signal with the signal transition of the refresh signal RFTG as an edge is capable of coping with it (in the case of the control method (1)). In this case, the refresh controller section 15 is set to such a configuration as to output the pulse signal. A signal outputted from the access arbiter 16 is inputted to a row-system controller section 17, which in turn outputs control signals CTL1 and CTL2 to the row pre-decoder 102, a main row decoder 103 and a word driver 18. Here, the main row decoder 103 is inputted with pre-decode signal AD(1) outputted from the row pre-decoder 102 and selects a word line to be driven by the word driver 18, of word lines WL0 through WLn disposed in a memory-cell array 140.

The refresh-thinning-out control circuit 1 is inputted with the refresh trigger signal RFTG in addition to the high-order refresh address Add(C) (m). A refresh permission signal RFEN used as an output signal thereof is inputted to the word driver 18 (control method (1)) or the refresh controller section 15 (control method (2)).

In the semiconductor memory device according to the first embodiment, it is required that the external access operation required by the input of the control signal from the control terminal 101, and the refresh operation required for each predetermined time from the built-in refresh timing timer section 14 are performed independently of each other. Thus, the access arbiter 16 makes an adjustment between the request signals REQ (O) and REQ(I) to thereby determine the operation to be executed. Described specifically, the control signal inputted from the control terminal 101 is inputted to the I/O controller section 13 from which an external access request is outputted to the access arbiter 16 as the external-access request signal REQ(O). The refresh trigger signal RFTG outputted from the refresh timing timer section 14 is directly outputted to the access arbiter 16 as the refresh request signal REQ(I) corresponding to a request for the refresh operation in the case of the control method (1), and is outputted thereto as the refresh request signal REQ(I) corresponding to the request for the refresh operation via the refresh controller section 15 in the case of the control method (2).

When either one of the external-access request signal REQ (O) and the refresh request signal REQ(I) is outputted to the access arbiter 16, the access arbiter 16 controls the row-system controller section 17 to execute the operation required. When the operation requests compete with each other, the access arbiter 16 makes arbitration to the external-access request signal REQ (O) and the refresh request signal REQ(I) to thereby control the row-system controller section 17, whereby the external access operation and the refresh operation are sequentially performed in a continuous form.

The row-system controller section 17 outputs a control signal CTL1 according to the result of arbitration by the access arbiter 16 and selects an address signal (Add(O) or Add(C)) to be inputted to the row pre-decoder 102. Further, the row-system controller section 17 outputs a control signal CTL2 to allow the main row decoder 103 to further decoder pre-decode signal AD(1) predecoded by the row pre-decoder 102 and activate the word driver 18 with suitable timing for thereby activating a word line (any of WL0 through WLn) selected by its decoding. Namely, the row-system controller section 17 sequentially outputs a series of the control signals CTL1 and CTL2 having a suitable timing difference therebetween, based on a start-up signal sent from the access arbiter 16.

When, for example, the external-access request signal REQ(O) and the refresh request signal REQ(I) are simultaneously inputted, the access arbiter 16 needs to determine the priority of an operation sequence. The access arbiter 16 is also capable of precedently selecting control for giving priority to avoidance of the disappearance or destroying of data and allowing the refresh operation to be placed ahead or control for giving priority to a response to an external access and allowing the refresh operation to be placed ahead. Regardless of the order of the operation sequence, a cycle time tCE is defined by both continuous operations.

The refresh-thinning-out function will next be explained. The refresh-thinning-out control circuit 1 judges for each refresh operation, whether the refresh operation can be executed, and outputs a refresh permission signal RFEN. The first embodiment illustrates the two methods of controlling the refresh-thinning-out operation according to the refresh permission signal RFEN ((1) and (2) in FIG. 1).

The control method (1) will first be described. According to the control method (1), when a refresh trigger signal RFTG is outputted from the refresh timing timer section 14, the refresh address counter 12 is counted up to output new refresh address Add(C). Predetermined high-order bits of the refresh address are inputted to the refresh-thinning-out control circuit 1 as a high-order refresh address Add(C) (m), where a decision as to whether a refresh operation for the newly-set refresh address Add(C) can be executed, is made.

If, for example, the refresh address Add(C) other than the least significant bit is inputted to the refresh-thinning-out control circuit 1 although one inputted to the refresh-thinning-out control circuit 1 is defined as the high-order refresh address Add(C) (m) of the predetermined high-order bits, then the unit of criterion or judgment is set with two word lines as one unit. If the refresh address Add(C) other then two low-order bits is inputted thereto, then the unit of criterion or judgment is set with four word lines as one unit. The unit of criterion can be freely set according to the setting of high-order bits. Further, the refresh-thinning-out control circuit 1 may take a configuration wherein all the bits of the refresh address Add(C) are inputted thereto without except for the low-order bits to make decisions every word lines.

A refresh permission signal RFEN indicative of the result of determination is inputted to the word driver 18 so that the activation of the word driver 18 is controlled. When the execution of the refresh operation is permitted by the refresh permission signal RFEN, the word driver 18 is activated. When the execution of the refresh operation is prohibited, the word driver 18 is maintained at a deactivated state.

On the other hand, a refresh trigger signal RFTG outputted from the refresh timing timer section 14 is inputted even to the access arbiter 16 as a refresh request signal REQ(C). In parallel with the process of judgment by the refresh-thinning-out control circuit 1, an adjustment to an access operation is made between the refresh trigger signal RFTG and the external-access request signal REQ(O), and control on the row system for decoding an address signal (Add(O) or Add(C)) to thereby select the corresponding word line is performed. Namely, when the refresh operation is controlled by the access arbiter 16, the row-system controller section 17 is started up to output a control signal CTL1. Thus, the row pre-decoder 102 pre-decodes the refresh address Add(C) and the main row decoder 103 decodes pre-decode signal AD(1) in response to a control signal CTL2 outputted after predetermined control timing, so that a word line intended for the refresh operation is selected.

The decision by the refresh-thinning-out control circuit 1 as to whether or not the refresh operation is executable, is made according to whether the high-order refresh address Add(C) (m) intended for the refresh operation corresponds to predetermined address stored in advance, based on data-holding characteristics of each memory cell, which discriminate whether the refresh operation is executable. Namely, the above judgment is basically performed by a comparison between the addresses. On the other hand, it is necessary to sequentially carry out many processes, as processes up to the driving of each word line, such as a first-come decision between the request signals REQ(O) and REQ(I) by the access arbiter 16, a decode process made via a multistage logic gate by the pre/main decoders 102 and 103, and a boosting process for driving each word line by the word driver 18, etc.

Thus, a processing time interval from the refresh trigger signal RFTG to the selection of each word line by the main row decoder 103 generally becomes longer than a decision time interval from the refresh trigger signal RFTG to the refresh permission signal RFEN. Therefore, the process of judgment by the refresh-thinning-out control circuit 1 as to whether the refresh operation is executable, can be perfectly embedded in a processing time interval of the row system.

Since the corresponding word line is selected by decoding of the main row decoder 103 after the setting of the word driver 18 to an active state when the execution of the refresh operation is permitted by the refresh-thinning-out control circuit 1, the refresh operation is performed without increasing the processing time of the row system. Since the decoding of the main row decoder 103 is executed with being delayed with respect to the setting of the word driver 18 to an inactive state where the execution of the refresh operation is prohibited, the refresh operation is not executed without driving the corresponding word line selected by the decoding.

Incidentally, while the first embodiment has described the case in which the refresh permission signal RFEN is used to control the activation of the word driver 18, the control on the activation thereof by the refresh permission signal RFEN may be effected on the pre-stage circuits such as the main row decoder 103 as an alternative to the word driver 18 if the processing time for the judgment of the refresh-thinning-out control circuit 1 is sufficient, from a relationship with the time required for the decode processing of the refresh address Add(C), which is performed between the row pre-decoder 102 and the word driver 18.

The control method (2) will next be explained. Predetermined high-order bits of new refresh address Add(C) produced by count-up of the refresh address counter 12 based on a refresh trigger signal RFTG are inputted to the refresh-thinning-out control circuit 1 as high-order refresh address Add(C) (m) in a manner similar to the control method (1), where a decision as to whether the refresh operation is executable, is made.

In the control method (2), there is provided the refresh controller section 15 for outputting a refresh trigger signal RFTG to the access arbiter 16 as a refresh request signal REQ(I). A refresh permission signal RFEN indicative of the result of determination is inputted to the refresh controller section 15, which is then activated and controlled to thereby control the output of the refresh request signal REQ(I). When the execution of the refresh operation is permitted by the refresh permission signal RFEN, the refresh request signal REQ(I) is outputted to the access arbiter 16. When the execution of the refresh operation is prohibited, no refresh request signal REQ(I) is outputted.

Namely, the refresh request signal REQ(I) is outputted to the access arbiter 16 according to the result of determination as to whether the refresh operation at the refresh address Add(C) set with respect to the refresh trigger signal RFTG is executable. On the other hand, an external-access request signal REQ(O) is outputted from the I/O controller section 13 whenever necessary according to a control signal inputted from the control terminal 101. Thus, when the external access operation and the refresh operation are in a state of competition, the refresh request signal REQ(I) is outputted with being delayed by a time interval required to discriminate whether the refresh operation is executable, with respect to the external-access request signal REQ(O).

Namely, there is a possibility that although the refresh operation is essentially placed ahead and the external access operation is to be executed successively, the refresh request signal REQ(I) will be inputted to the access arbiter 16 with being delayed with respect to the external-access request signal REQ(O) due to the delay equivalent to the judgment time interval where an external access request is issued subsequently to the refresh trigger signal RFTG or accesses are simultaneously made according to the settings in a state of competition of the accesses. Since the process of determination by the refresh-thinning-out control circuit 1 can be perfectly embedded into a preceding external access operation although an operation sequence is reversed, a cycle time defined by the continuous operations of the external access operation and the refresh operation becomes no long with respect to the original provision.

When the refresh operation is prohibited under refresh-thinning-out control, a series of processing operations of the row system from the process of an adjustment to each request signal to the process of decoding each address, further, the process of driving each word line are prohibited upon the refresh operation. Unnecessary current consumption can be reduced.

Incidentally, since the setting of the number of bits of the high-order refresh address Add(C) (m) having a predetermined high-order bits is similar to the case of the control method (1), and similar operation/effects are brought about, the description thereof herein will be omitted.

Figure 2:
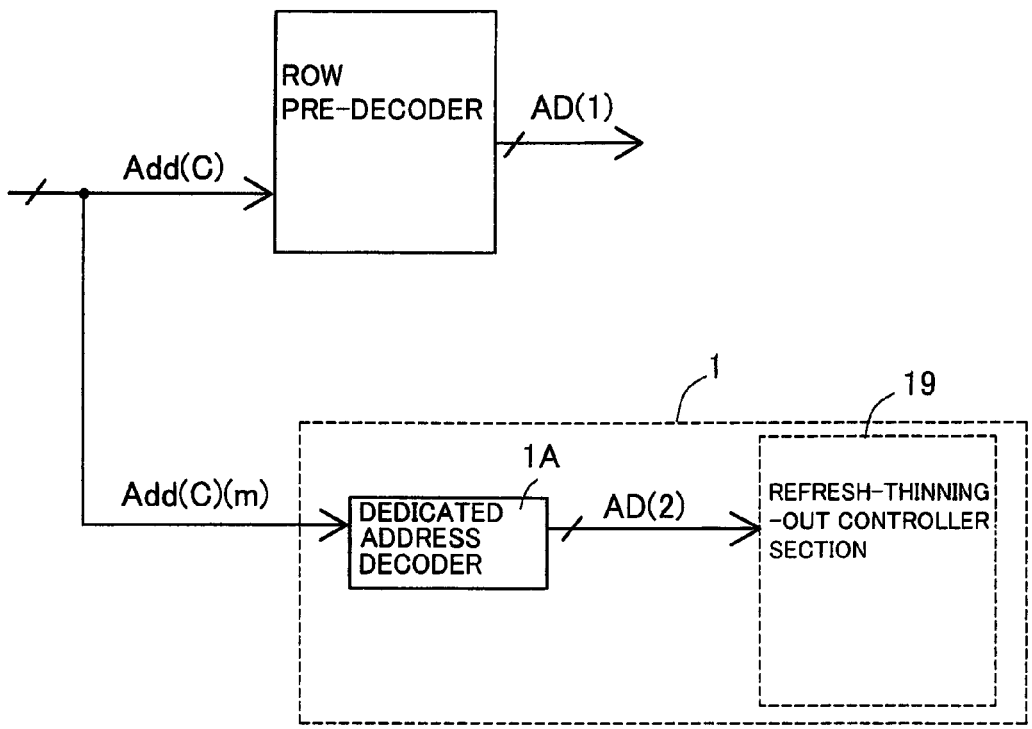
FIG. 2 is a circuit block diagram illustrating an example of the input of address to a refresh-thinning-out control circuit employed in the first embodiment.

FIG. 2 shows an example of the input of high-order refresh address Add(C) (m) to the refresh-thinning-out control circuit 1. A dedicated address decoder 1A is provided at an input stage of the refresh-thinning-out control circuit 1. A dedicated decode signal AD(2) decoded according to the input high-order refresh address Add(C) (m) is inputted to a refresh-thinning-out controller section 19 for making a decision as to refresh thinning out.

Since the dedicated decode signal AD(2) is a decode signal obtained by decoding the high-order refresh address Add(C) (m), the unit of judgment as to the execution/non-execution of the refresh operation by the refresh-thinning-out controller section 19 can be expanded by the number of bits of an excepted low-order address according to the high-order refresh address Add(C) (m) inputted to the dedicated address decoder 1A. If the number of bits of the low-order address to be excepted is suitably set, then the determination as to the execution/non-execution of the refresh operation can be performed in a suitable decision unit. While an increase in die size due to a fuse or the like for storing an address used for setting the presence or absence of refresh thinning out for each predetermined word line is being suppressed, a decision as to whether refresh thinning out is executable, is made for each predetermined unit of word lines to thereby make it possible to reduce current consumption.

Figure 3:
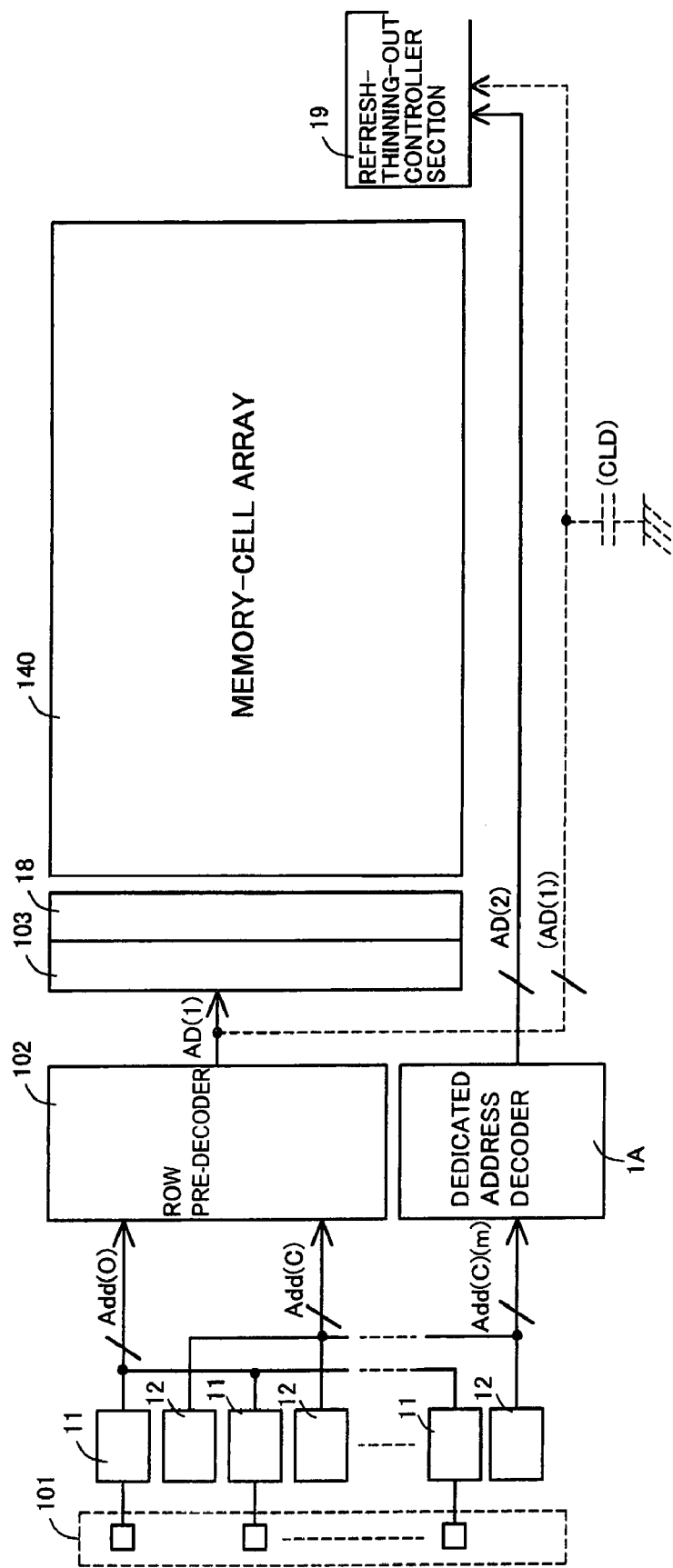
FIG. 3 is a layout diagram depicting an example of a layout arrangement suitable for being equipped with a dedicated address decoder.

FIG. 3 shows a layout example suitable for being equipped with a dedicated address decoder 1A. FIG. 3 corresponds to a case in which refresh address counter 12 is depressively disposed in the neighborhood of row address buffers 11 disposed every address terminals 101. The refresh address counters 12 and the refresh-thinning-out controller section 19 are disposed away from one another.

In such a layout, an address signal inputted to the refresh-thinning-out controller section 19 is also considered to be set as pre-decode signal AD(1) outputted from the row pre-decoder 102. However, since a wiring path up to the refresh-thinning-out controller section 19 is long, a capacitance load CLD attendant on the pre-decode signal AD(1) increases due to parasitic capacitance of a wiring, and the like. Since the pre-decode signal AD(1) is inputted even to the main row decoder 103 to carry out the selection of each word line, a processing time interval of the row system up to the selection of each word line might be delayed as a result of a drive delay of the pre-decode signal AD(1) due to the substantial capacitance load CLD.

Thus, the dedicated address decoder 1A is provided to allow the dedicated decode signal AD(2) to have charge of the propagation of the address signal to the refresh-thinning-out controller section 19. The unnecessary capacitance load CLD is eliminated from the pre-decode signal AD(1) inputted to the main row decoder 103, so that the drive delay of the pre-decode signal AD(1) can be brought to the required minimum.

Figure 4:
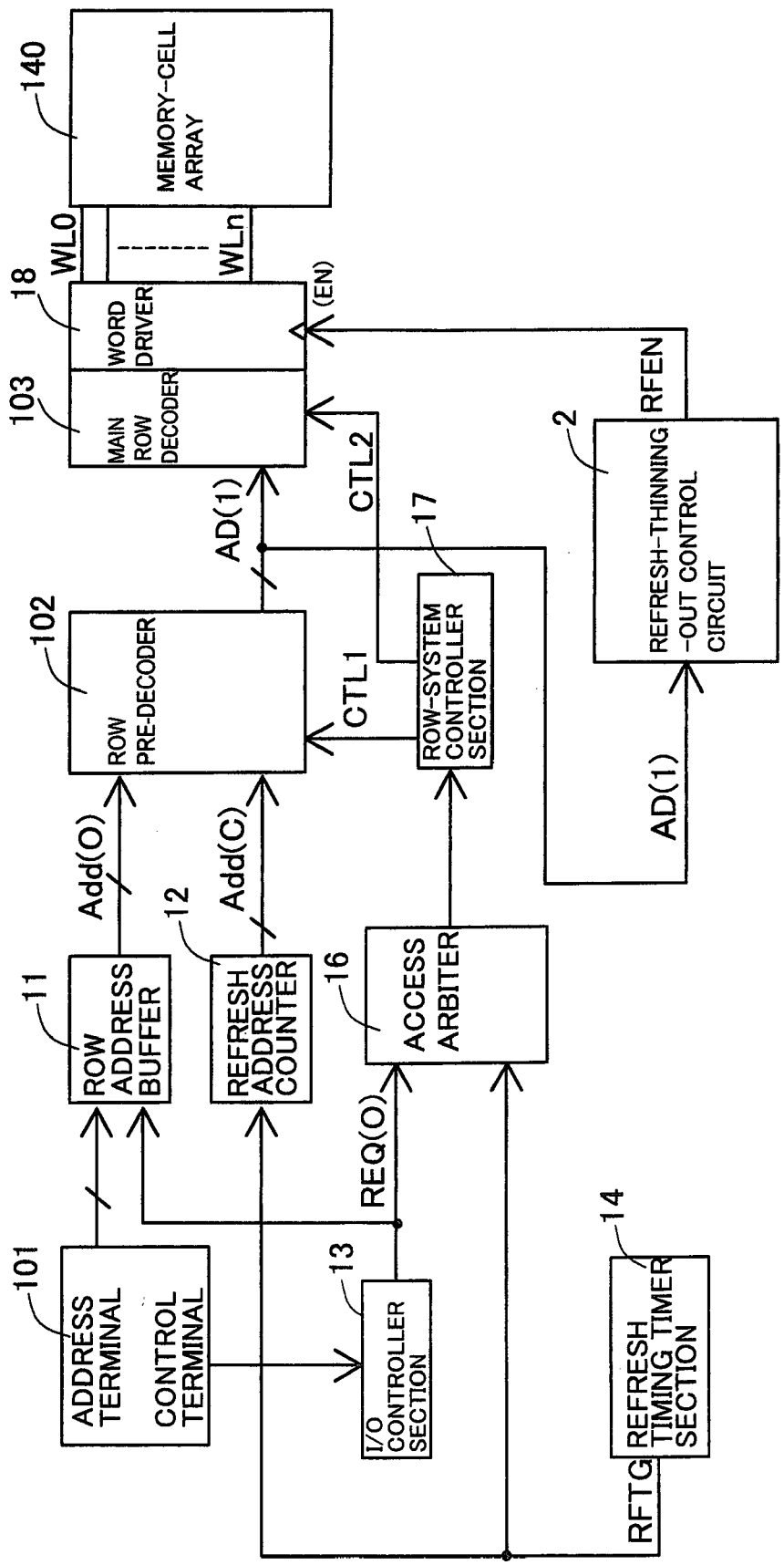
FIG. 4 is a circuit block diagram of a semiconductor memory device according to a second embodiment.

A second embodiment shown in FIG. 4 corresponds to a case in which in a manner similar to the first embodiment, a refresh-thinning-out function is added to operation specs in which a built-in refresh operation and an external access operation are activated independently of each other with occasional timings. The present embodiment is a semiconductor memory device wherein a refresh-thinning-out function is provided after compatibility of a pseudo SRAM or the like to an SRAM or the like has been made more complete, whereby even a reduction in current consumption at standby can be achieved.

The second embodiment is provided with a refresh-thinning-out control circuit 2 inputted with pre-decode signal AD(1) outputted from a row pre-decoder 102, as an alternative to the refresh-thinning-out control circuit 1 inputted with the refresh address Add(C).

A judgment process by comparison between addresses is generally performed in a short period of time with respect to sequential processes up to the driving of each word line, such as a decode process made via a multistage logic gates by a main decoder 103, and a boosting process for driving each word line by a word driver 18, etc. Thus, the process of making a decision as to the execution/non-execution of the refresh operation by the refresh-thinning-out control circuit 2 can be perfectly embedded in a processing time interval of a row system in a manner similar to the case of the control method (1) according to the first embodiment.

Since the present embodiment takes such a configuration as to supply the pre-decode signal AD(1) outputted from the row pre-decoder 102, a dedicated address decoder becomes unnecessary and an increase in die size in the semiconductor memory device can be suppressed. Since the present embodiment is similar in other configuration to the control method (1) of the first embodiment and brings about similar operations and effects, the description thereof herein will be omitted.

Figure 5:
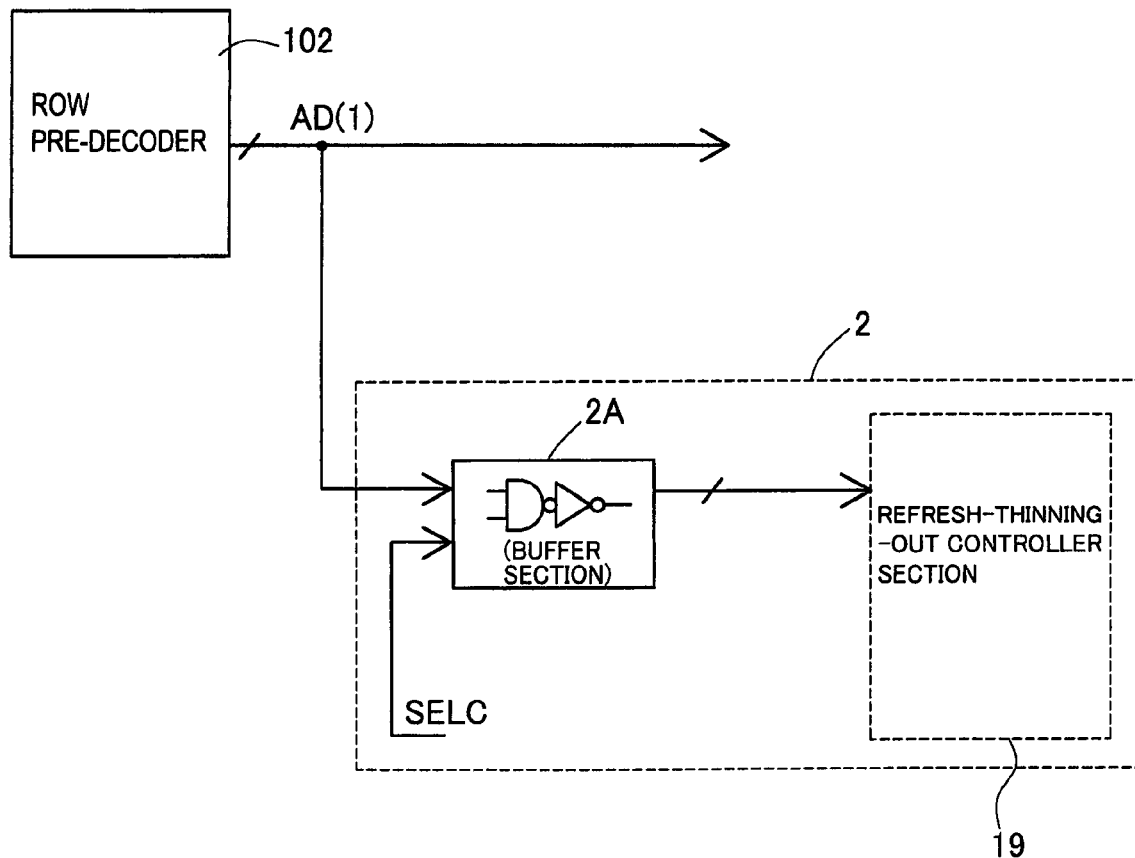
FIG. 5 is a circuit block diagram showing an example of the input of address to a refresh-thinning-out control circuit employed in the second embodiment.

FIG. 5 shows an example of the input of the pre-decode signal AD(1) to the refresh-thinning-out control circuit 2. A buffer section 2A is provided at an input stage of the refresh-thinning-out control circuit 2, which is capable of taking in or capturing the input pre-decode signal AD(1) according to a control signal SELC. The buffer section 2A can be made up of an AND logic gate, for example. Alternatively if such a configuration that the input of the pre-decode signal AD(1) can be controlled based on the control signal SELC, is taken therefor, it is then needless to say that it can be applied to the buffer section. The buffer section may be made up of a transfer gate or the like controlled by the control signal SELC.

Figure 6:
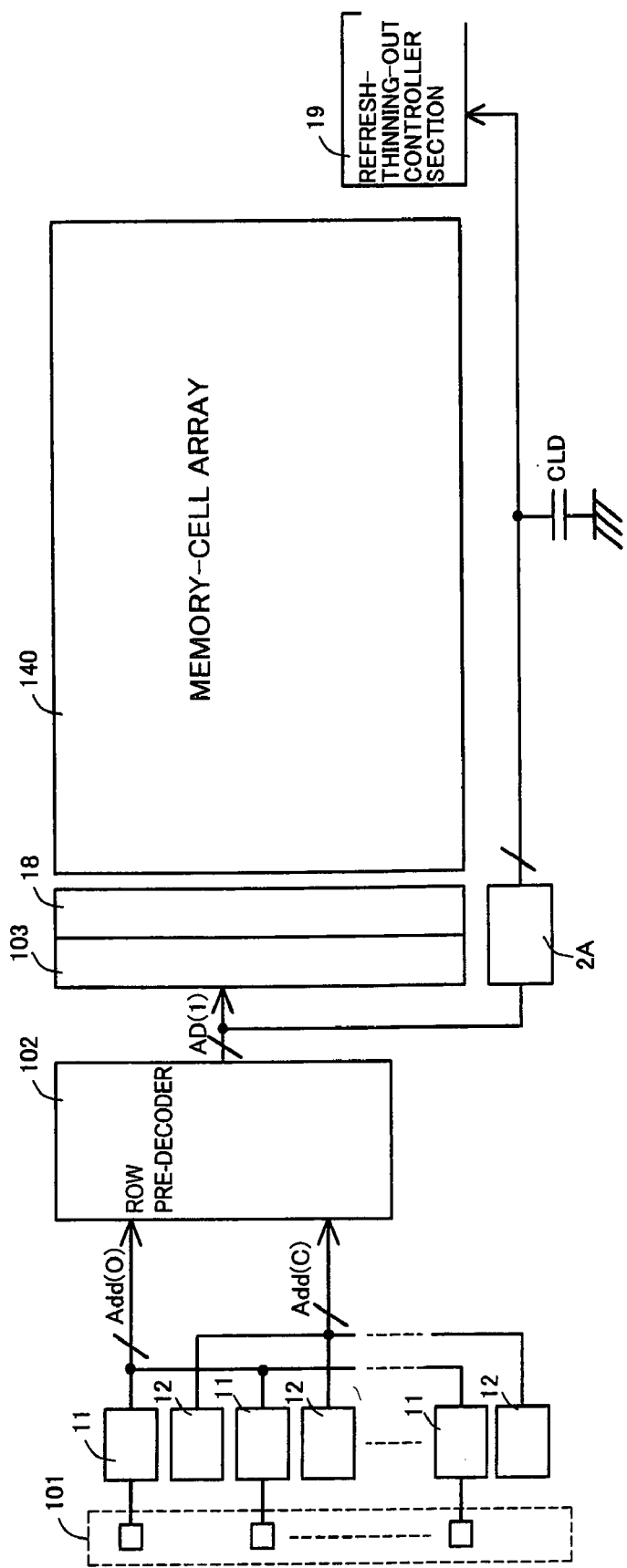
FIG. 6 is a layout diagram illustrating an example of a layout arrangement suitable for provision with a buffer section for receiving pre-decode signal from a row pre-decoder.

FIG. 6 shows a layout example suitable for being equipped with a buffer section 2A as an alternative to the dedicated address decoder 1A shown in FIG. 3. In this case, the buffer section 2A is disposed in the vicinity of a row pre-decoder 102. Incidentally, the present example is similar to the case of FIG. 3 in that refresh address counters 12 are depressively disposed in the neighborhood of row address buffers 11 disposed every address terminals 101, and the refresh address counter 12 and a refresh-thinning-out controller section 19 are disposed away from one another.

In such a layout, a substantial capacitance load CLD parasitic on a long wiring path or route from the row pre-decoder 102 to the refresh-thinning-out controller section 19 is segmented or divided by the buffer section 2A disposed in the neighborhood of the row pre-decoder 102. Therefore, a drive delay of the pre-decode signal AD(1) can be brought to the required minimum without adding the unnecessary capacitance load CLD to the path for the pre-decode signal AD(1) from the row pre-decoder 102 to the main row decoder 103.

Figure 7:
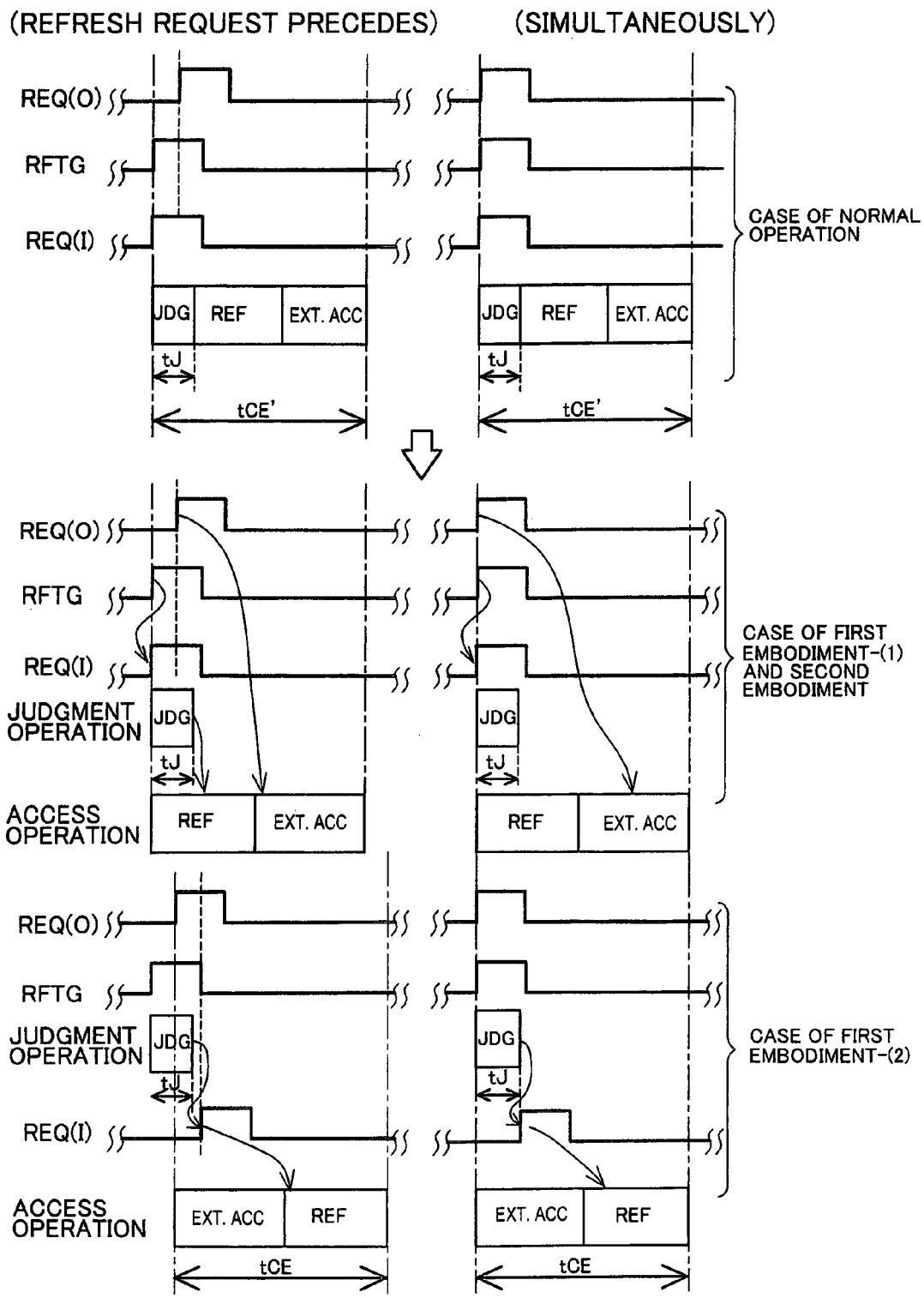
FIG. 7 is an operation waveform diagram showing access competition in a pseudo SRAM.

Access operation waveforms employed in the first and second embodiments will next be illustrated in FIGS. 7 through 11. FIG. 7 corresponds to a case in which a refresh request and an external access request compete with each other in a pseudo SRAM. FIG. 7 illustrates a case in which the refresh request precedes the external access request (see operation waveforms on the left side in FIG. 7) and a case in which both access requests are simultaneously produced (see operation waveforms on the right side in FIG. 7). When the access requests are taken simultaneously, the setting of giving precedence to the refresh operation will now be shown.

Figure 24:
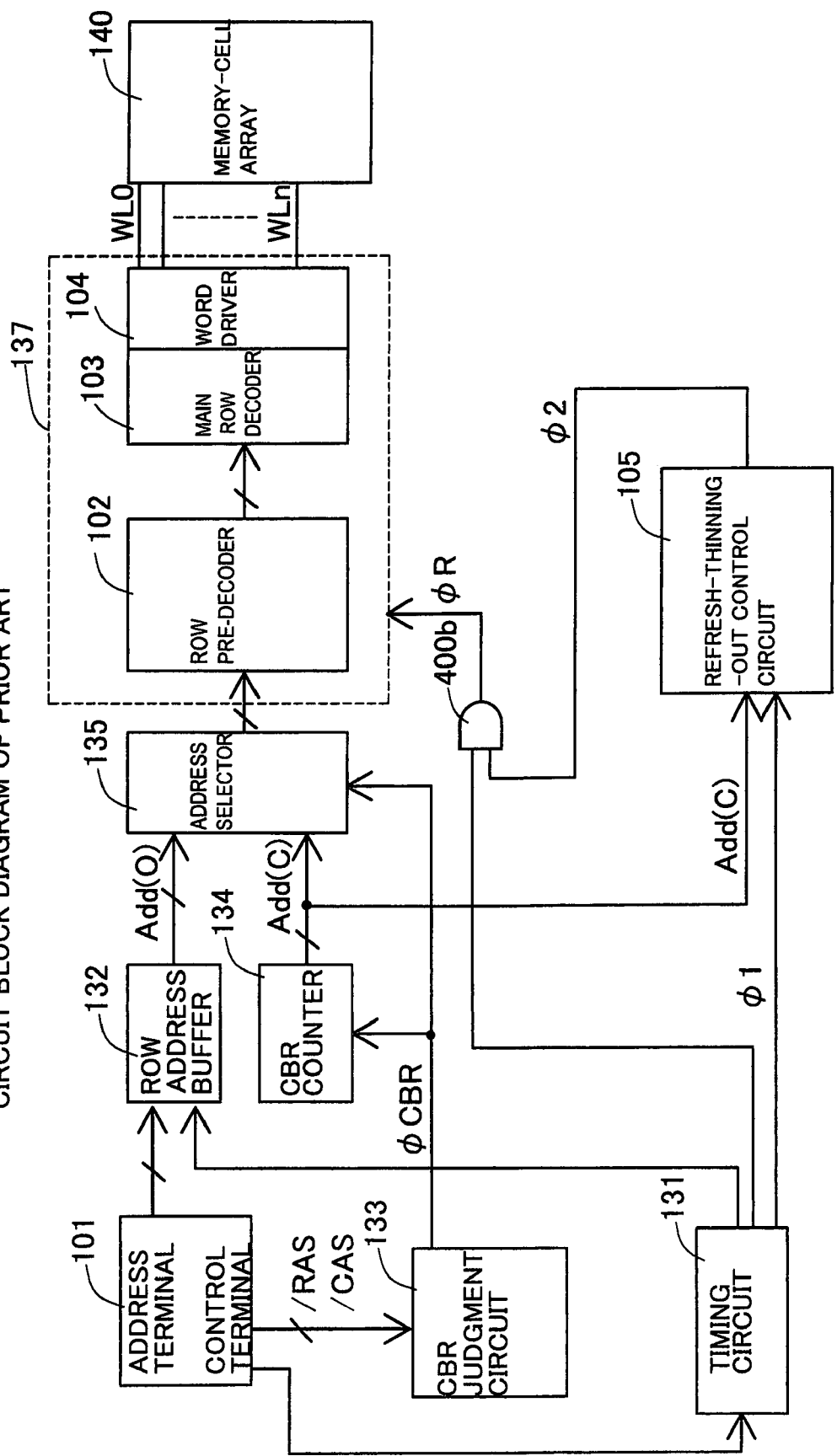
FIG. 24 is a circuit block diagram of a semiconductor memory device illustrative of a prior art.
Figure 25:
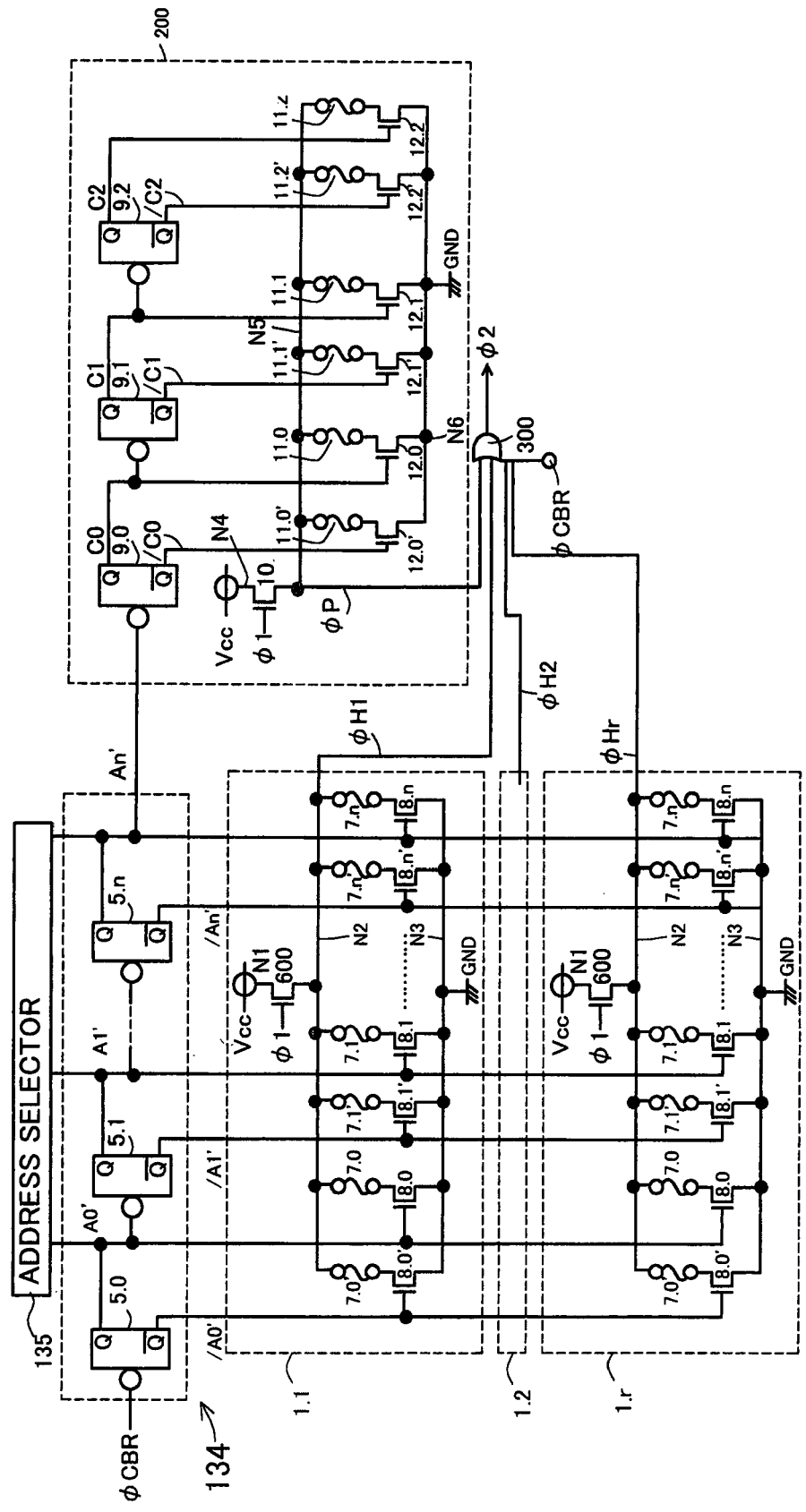
FIG. 25 is a circuit block diagram showing a refresh-thinning-out control circuit employed in the prior art as the center.

A decision or judgment as to execution/non-execution of the refresh operation is normally performed during the refresh operation. Described specifically, refresh address Add (C) produced based on a refresh command signal φCBR outputted from a CBR judgment circuit 133 is discriminated by a refresh-thinning-out control circuit 105 in FIG. 24, and the result of judgment is outputted from the refresh-thinning-out control circuit 105 as a refresh permission signal φ2, so that an AND logic gate 400b is gated to output an activation signal φR. The activation signal φR is a signal for activating a row address decoder 137 and is also a signal corresponding to the control signal CTL1 first outputted from the row-system controller section 17 employed in each of the first and second embodiments. Namely, in FIGS. 24 and 25, the decoding of a row address is started after the process of judgment by the refresh-thinning-out control circuit 105, and a judgment or discrimination time is added to the time required to execute the refresh operation.

The operation waveform in the normal or ordinary case in FIG. 7 shows that this judgment time tJ is added aside from an execution time at the refresh operation. Therefore, a judgment time tJ for judging whether refresh thinning out is executable, is added in addition to the time required to execute the refresh operation and the external access operation, whereby a cycle time tCE' at the time that accesses compete with each other, is defined. Since the continuous execution time for the refresh operation and the external access operation corresponds to a cycle time tCE at the access competition where no thinning-out control is done, the judgment time tJ is added to this time to thereby define a cycle time tCE'(=tCE+tJ), thus incurring an increase in cycle time.

On the other hand, the judgment time tJ is embedded or charged in the time required to execute the refresh operation or the time required to execute the external access operation in the first and second embodiments. In the case of the control method (1) of the first embodiment, and the second embodiment, the refresh trigger signal RFTG is inputted to the access arbiter 16 as the refresh request signal. Based on the refresh address Add(C) outputted from the refresh trigger signal RFTG, thinning-out is judged or discriminated and the refresh operation is started. Since the judgment time tJ is embedded in a first half of the execution time of the refresh operation, a judgment process does not rat-control the original refresh operation, and the cycle time tCE is defined by the continuous execution time for the refresh operation and the external access time.

In the case of the control method (2) of the first embodiment, thinning-out judgment is performed precedently based on the refresh address Add(C) outputted from the refresh trigger RFTG. Since the refresh controller section 15 is maintained at its inactive state during this period, no refresh request signal REQ(I) is outputted to the access arbiter 16. If the external-access request signal REQ(O) is generated during a period for this judgment process, then the external access operation is performed precedentially. Since the judgment process is embedded in a first half of the time required to execute the external access operation, the judgment process neither rate-controls the original refresh operation nor the external access operation. Therefore, a cycle time tCE is defined by the time required to continuously execute the refresh operation and the external access operation. Incidentally, a competition operation in this case is started from the point of time of occurrence of the external-access request signal REQ (O) with being delayed from the time of occurrence of the precedent refresh trigger signal, whereas the external access operation is not delayed from the original access.

Figure 8:
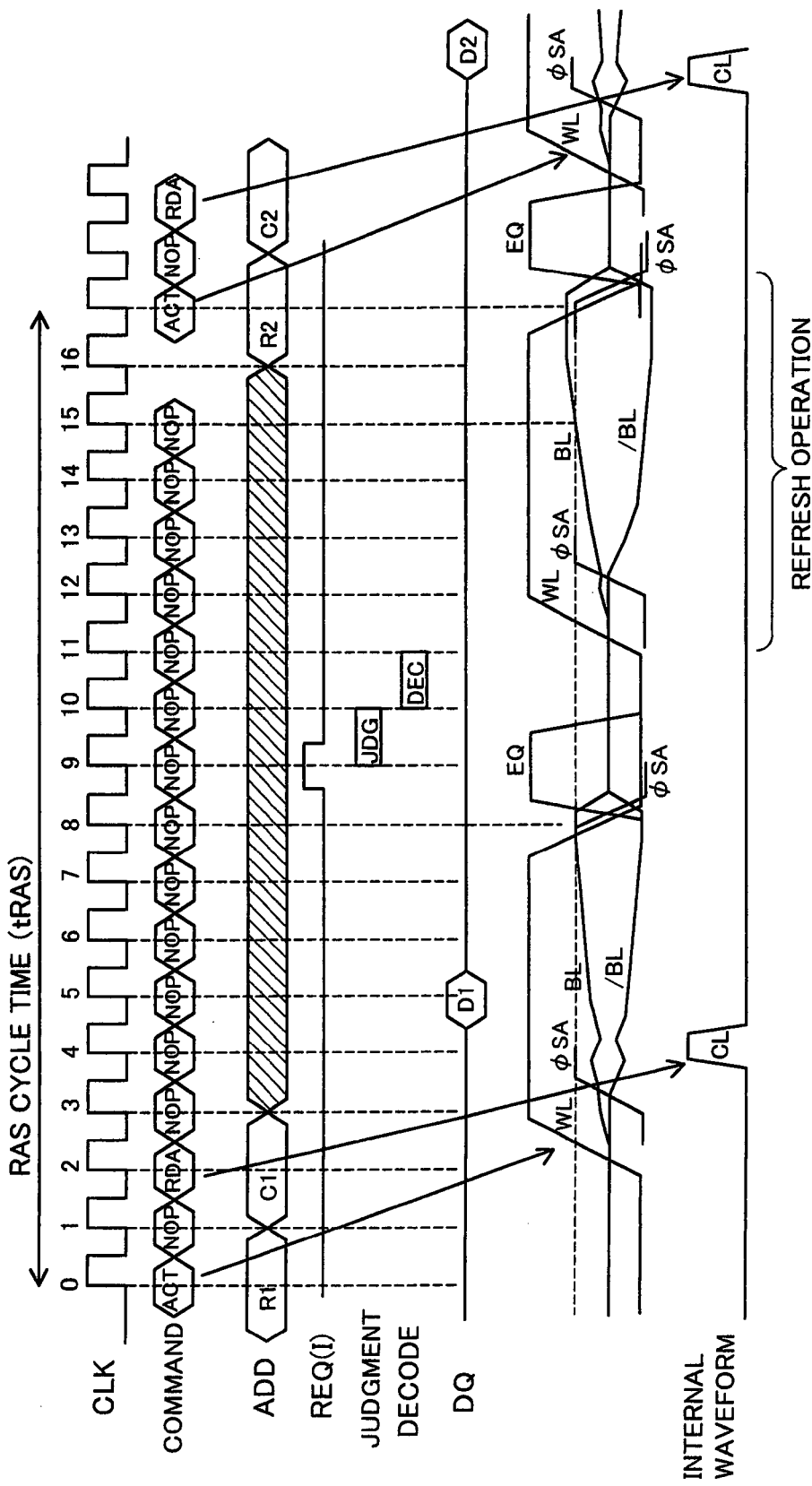
FIG. 8 is an operation waveform diagram of a burst length 1 in a pseudo SSRAM (normal operation)
Figure 9:
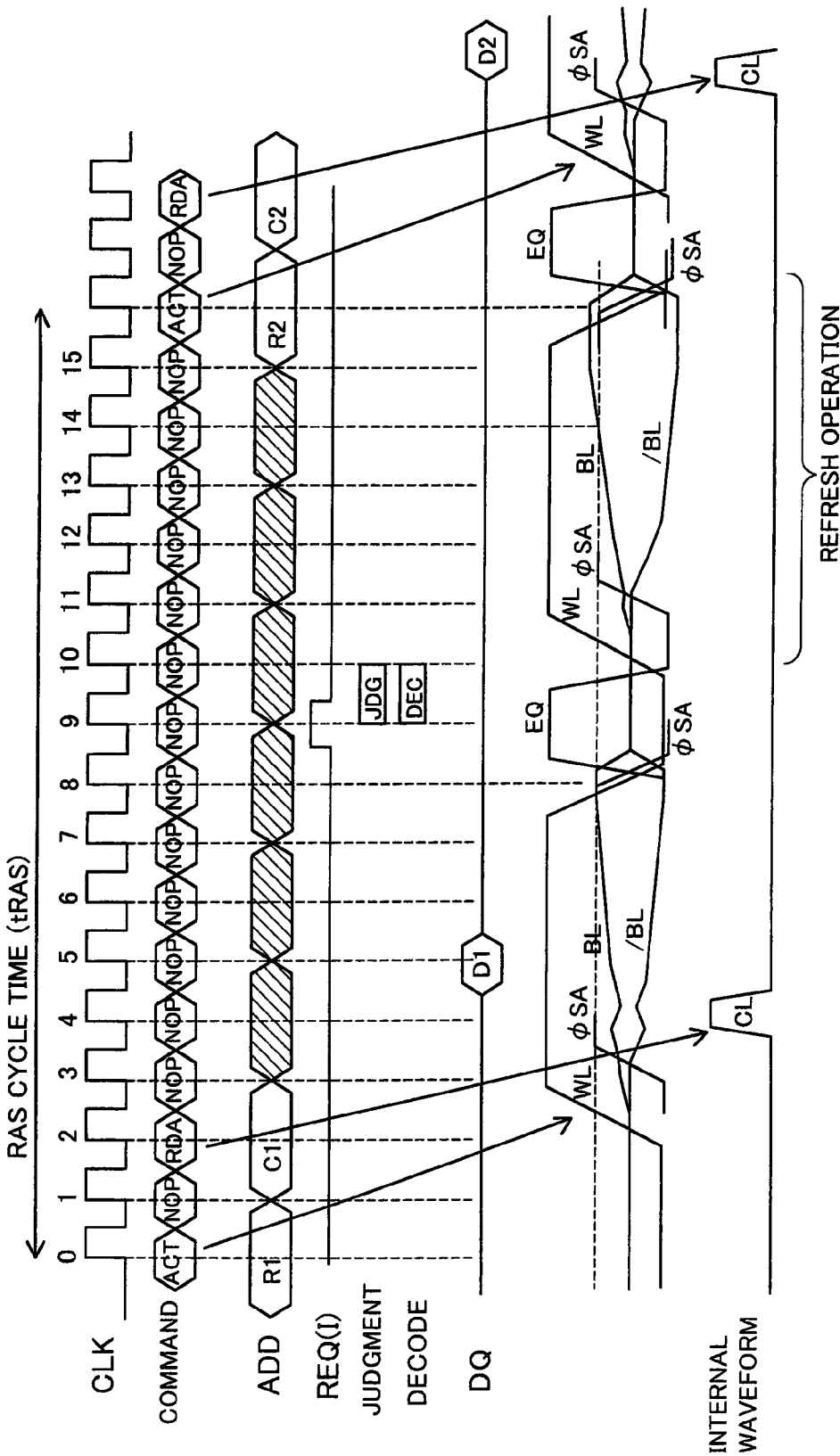
FIG. 9 is an operation waveform diagram of a burst length 1 in a pseudo SSRAM (first embodiment-(1) and second embodiment)
Figure 10:
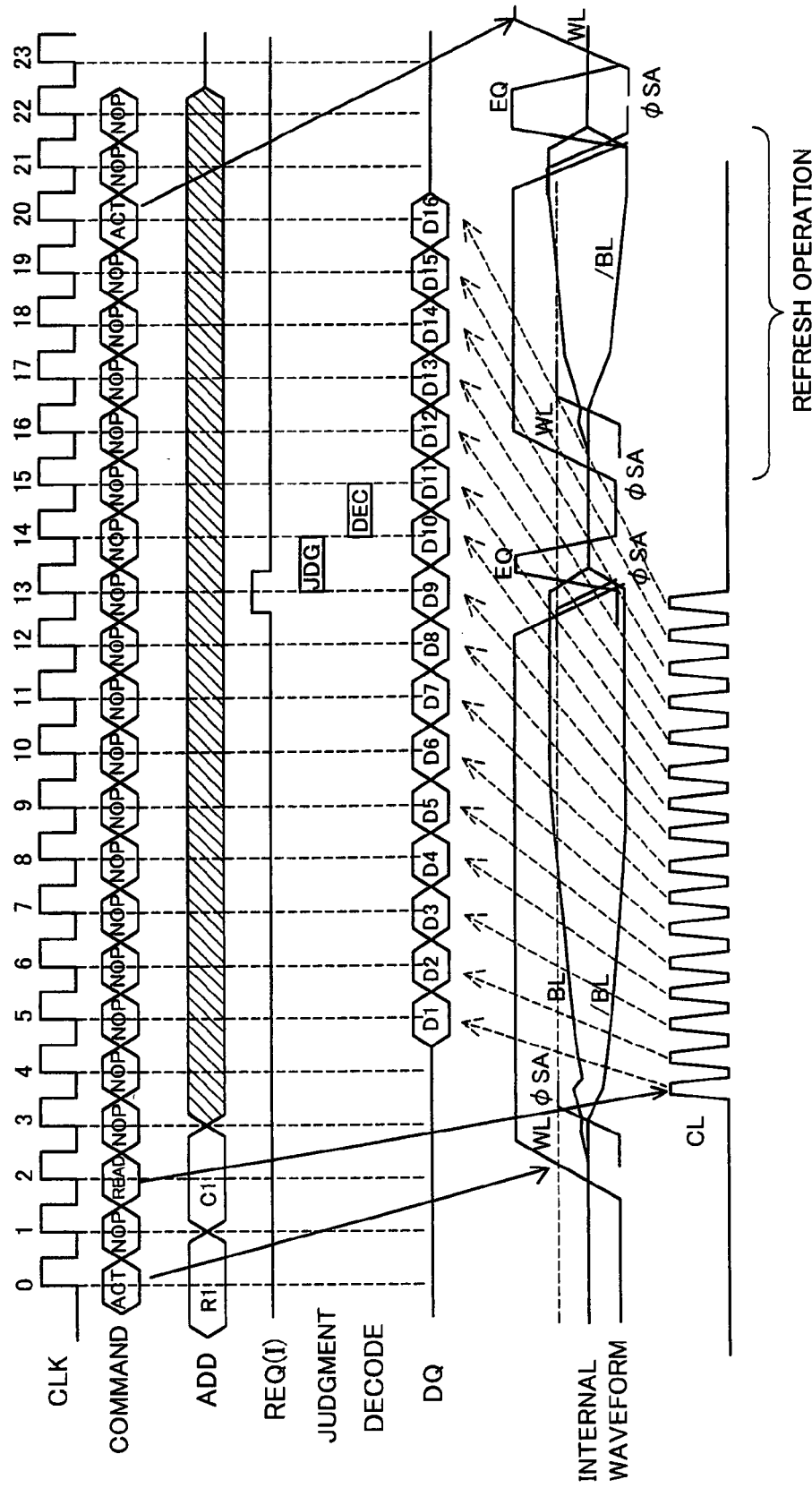
FIG. 10 is an operation waveform diagram of a multi-burst length in the pseudo SSRAM (normal operation)
Figure 11:
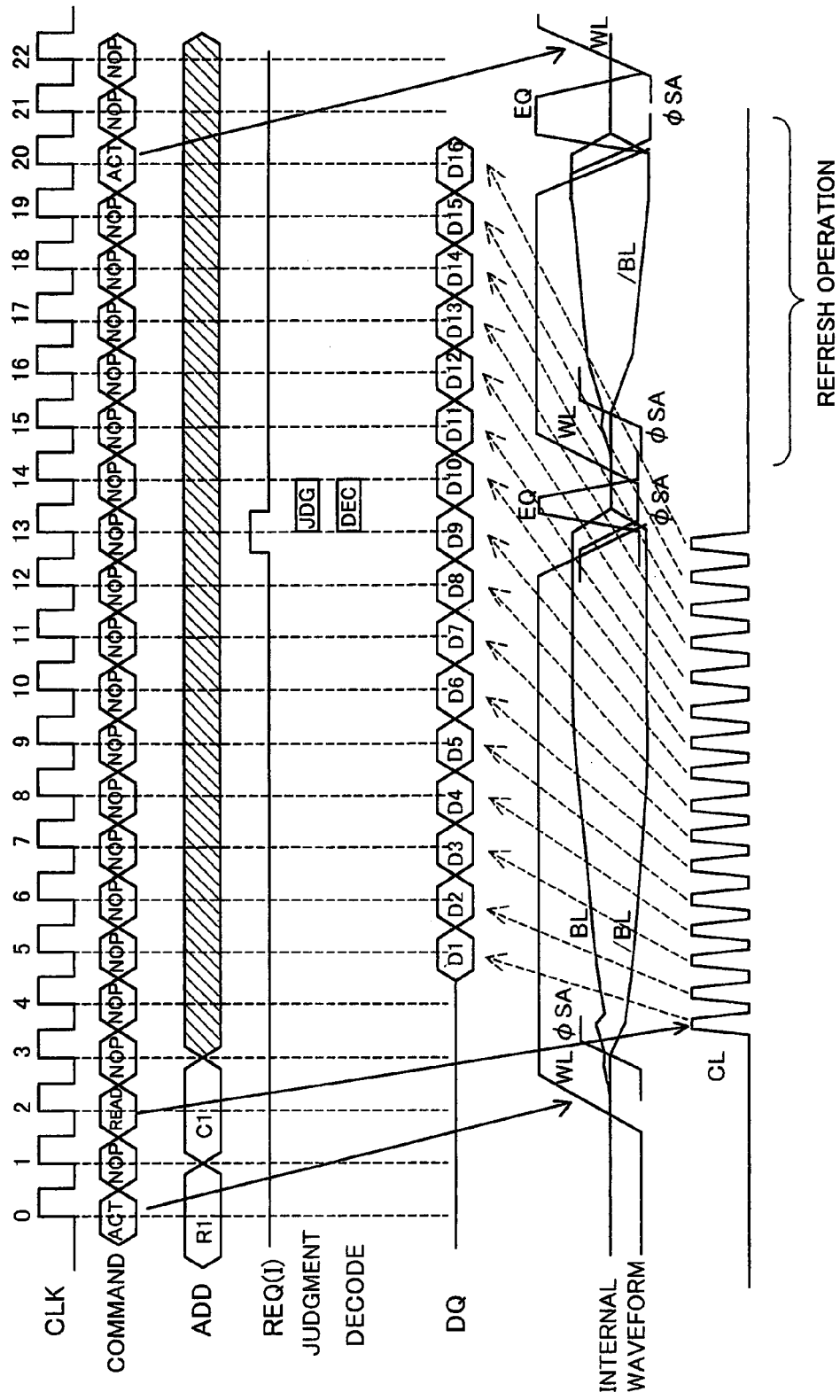
FIG. 11 is an operation waveform diagram of a multi-burst length in the pseudo SSRAM (first embodiment-(1) and second embodiment)

FIGS. 8 through 11 respectively show a case in which refresh operations are embedded in burst operations in a synchronous semiconductor memory device such as a pseudo SSRAM or the like. FIGS. 8 and 9 illustrate a burst length 1, and FIGS. 10 and 11 show a multi-burst length.

Here, the embedding of the refresh operation indicates operation specs in which a refresh operation is embedded in a burst cycle so that even the refresh operation can be executed without interruption of the burst operation.

The operation of the burst length 1 in the normal case shown in FIG. 8 corresponds to the execution of a read operation (operation at RDA command) with an auto precharge operation with CAS latencies 3. As described in FIG. 7, there is a case in which a decision as to the execution/non-execution of the refresh operation must be performed in the refresh-thinning-out function. Namely, it shows a case in which a refresh request signal REQ(I) is produced at a clock CLK9 in which a burst operation is finished and an equalize operation of each bit line is being performed. If the refresh-thinning-out function is absent, then the equalize operation is completed in a cycle of the clock CLK9 (high level period of signal EQ in FIG. 8). Thereafter, when a word line WL for the refresh operation rises in a cycle of a clock CLK10, a refresh request signal REQ(I) is generated at the clock CLK9 by the refresh-thinning-out function. Therefore, when the refresh operation is permitted after the determination as to the execution/non-execution of the refresh operation has been made, the process of decoding refresh address (C) is performed in a cycle of a clock CLK10 in the next cycle. Namely, with the introduction of the refresh-thinning-out function, a judgment time equivalent to one cycle is required and a dedicated clock cycle must be added by one cycle (clock CLK10 in FIG. 8). As compared with a case in which a RAS cycle time tRAS in the absence of the refresh-thinning-out function is 15 clock cycles, 16 clock cycles added with one clock cycle are needed.

On the other hand, the operation waveforms of FIG. 9 show ones in the case of the control method (1) employed in the first embodiment, and the second embodiment. As described in FIG. 7, a judgment process is embedded in an address decode time for the refresh operation. Since the judgment process and the process of decoding refresh address Add(C) are parallel-processed in the same clock cycle (clock CLK9 in FIG. 9), the addition of a dedicated clock cycle is not necessary even if the refresh-thinning-out function is introduced. A RAS cycle time is 15 clock cycles identical to the RAS cycle time tRAS in the case of the absence of the refresh-thinning-out function, and the refresh operation having the refresh-thinning-out function can be embedded.

FIG. 10 shows operation waveforms of burst lengths 16 as an operation of a multi-burst length in a normal or ordinary case. This is equivalent to a case in which a read operation (operation at RDA command) with an auto precharge operation is performed with CAS latencies 3. Upon the operation of the multi-burst length, for embedding a refresh operation shown in FIG. 10, the opening/closing of a switch at reading of data from each bit line pair (BL and /BL) is not synchronized with a clock CLK and operated in a cycle faster than it. Namely, the data is read prior to read timing based on the clock CLK. The precedentially-read data is stored in a temporary holding circuit (not shown) such as a data buffer circuit or the like and takes such specs as to be outputted outside in synchronism with a clock CLK corresponding to its subsequent read timing. Since the data is read precedentially, each bit line pair (BL and /BL) can be equalized with timing faster than in the case of external specs. Therefore, the operation can be transitioned to an equalize operation at a clock CLK13.

As to the refresh-thinning-out function, however, there is a case in which a decision as to the execution/non-execution of a refresh operation must be made independently in a manner similar to the operation of the burst length 1 (see FIG. 8) even in this case. Namely, when a refresh request signal REQ(I) is produced at a clock CLK13 at which the equalize operation of each bit line is being performed, the process of decoding refresh address Add(C) must be performed at a clock CLK14 at which a word line WL for the refresh operation rises, in the absence of the refresh-thinning-out function. Namely, with the introduction of the refresh-thinning-out function, a dedicated clock cycle must be added by one cycle (clock CLK14 in FIG. 10). As compared with a case in which a RAS cycle time tRAS in the absence of the refresh-thinning-out function is 20 clock cycles, 21 clock cycles added with one clock cycle are needed.

On the other hand, the operation waveforms of FIG. 11 show ones in the case of the control method (1) employed in the first embodiment, and the second embodiment. In a manner similar to FIG. 9, a judgment process is embedded in an address decode time for the refresh operation. Since the judgment process and the process of decoding refresh address Add(C) are parallel-processed in the same clock cycle (clock CLK13 in FIG. 11), the addition of a dedicated clock cycle is not necessary even if the refresh-thinning-out function is introduced. A RAS cycle time is 20 clock cycles identical to the RAS cycle time tRAS in the absence of the refresh-thinning-out function, and the refresh operation having the refresh-thinning-out function can be embedded.

Incidentally, while the operations have been described in FIGS. 9 and 11 assuming the control method (1) of the first embodiment and the second embodiment, the judgment process can be embedded even in the control method (2) of the first embodiment. Since this is similar to the description of the access competition in the pseudo SRAM in FIG. 7, the description thereof herein will be omitted.

According to the control method (1) of the first embodiment and the second embodiment as described in detail above, the judgment process as to the execution/non-execution of the refresh operation in each of the refresh-thinning-out control circuits 1 and 2 can be embedded in the time required to perform decode processing of the refresh address Add(C) indicative of the corresponding address. Therefore, the judgment time tJ required for the execution/non-execution of the refresh operation is added to the cycle time tCE corresponding to the execution time at the access for competition with the external access operation, and hence the cycle time tCE does not increase. Even in the case of the operation specs in which the refresh operation is embedded in the burst operation, the judgment time tJ is not added to the RAS cycle time tRAS and hence the RAS cycle time tRAS does not increase without increasing the clock cycle.

According to the control method (2) of the first embodiment as well, since the refresh request signal REQ(I) is not used as the adjustment signal without being inputted to the access arbiter 16 at the stage prior to the judgment as to the execution/non-execution of the refresh operation in the refresh-thinning-out control circuit 1, the external access operation is immediately preformed if the external-access request signal REQ(O) is produced during the process for the judgment as to the execution/non-execution thereof. The time tJ required to make a judgment as to the execution/non-execution thereof is not added as the delay of the external access operation. Accordingly, the judgment time tJ is not added to the cycle time tCE corresponding to the execution time at the access for competition with the external access operation including the refresh operation, and hence the cycle time tCE does not increase. Even in the case of the operation specs in which the refresh operation is embedded in the burst operation, the judgment time tJ is not added to the RAS cycle time tRAS and hence the RAS cycle time tRAS does not increase without increasing the clock cycle.

When the judgment for prohibiting the refresh operation is made to the refresh request signal REQ(I), the refresh request signal REQ(I) is not made available for adjustments between the refresh request signal REQ(I) and the external-access request signal REQ(O). Namely, when the refresh operation is judged to be prohibited, the process of decoding the refresh address Add(C) indicative of the corresponding address, subsequent to the access arbiter 16 corresponding to a request signal-to-request signal adjustor section is not operated, and unnecessary circuit operations are eliminated, thereby making it possible to reduce current consumption.

According to the dedicated address decoder 1A employed in the first embodiment, the refresh-thinning-out controller section 19 may be equipped with a storage section comprised of a fuse, a ROM, a RAM or the like for each decoded dedicated decode signal AD(2) corresponding to a corresponding address group. As compared with the case in which it is provided for each address for the corresponding word line intended for the refresh operation, the exclusively possessed area of the storage section to a die size of a semiconductor memory device can be reduced.

The designation of the dedicated decode signal AD(2) necessary for the judgment as to the execution/non-execution of the refresh operation is performed by providing the dedicated address decoder 1A used as the dedicated decoder to thereby decode the high-order refresh address Add(C) (m) indicative of the corresponding address intended for the refresh operation. Therefore, the load on the row pre-decoder 102 will not increase upon the judgment as to the execution/non-execution of the refresh operation. Even when the determination as to the execution/non-execution of the refresh operation is an unnecessary setting or even in the case of the external access operation, the load imposed on the row pre-decoder 102 will not increase. Even when the function of judging whether the refresh operation is executable, is introduced, an increase in the load on the access operation is not incurred, and an increase in current consumption, a delay in cycle time, etc. are not brought about.

Since the dedicated decode signal AD (2) can be specified independently by the dedicated address decoder 1A, the number of occurrences of the refresh request signal REQ(I) collected up as a unit for judgment is set without any restriction on the decode processing of the row pre-decoder 102 to thereby make it possible to specify or designate the dedicated decode signal AD(2). Since the units of decisions made as to whether the refresh operation is executable, are collected up every dedicated decode signal AD (2), the decision as to execution of the refresh operation might be made inclusive of each word line requiring no execution of the refresh operation. However, the number of occurrencies of the refresh request signal REQ(I) collected up for each dedicated decode signal AD (2) is adjusted by the selection of the high-order refresh address Add(C) (m) to thereby make it possible to realize a reduction in current consumption by refresh-thinning-out while an increase in the exclusively possessed area of the storage section is being suppressed.

According to the second embodiment, the row pre-decoder 102 can share the designation of the pre-decode signal AD (1) indicative of the corresponding address group for making a decision as to execution/non-execution of the refresh operation. Even if the function of judging whether the refresh operation is executable, is introduced, an increase in die size of the semiconductor memory device can be suppressed.

Figure 12:
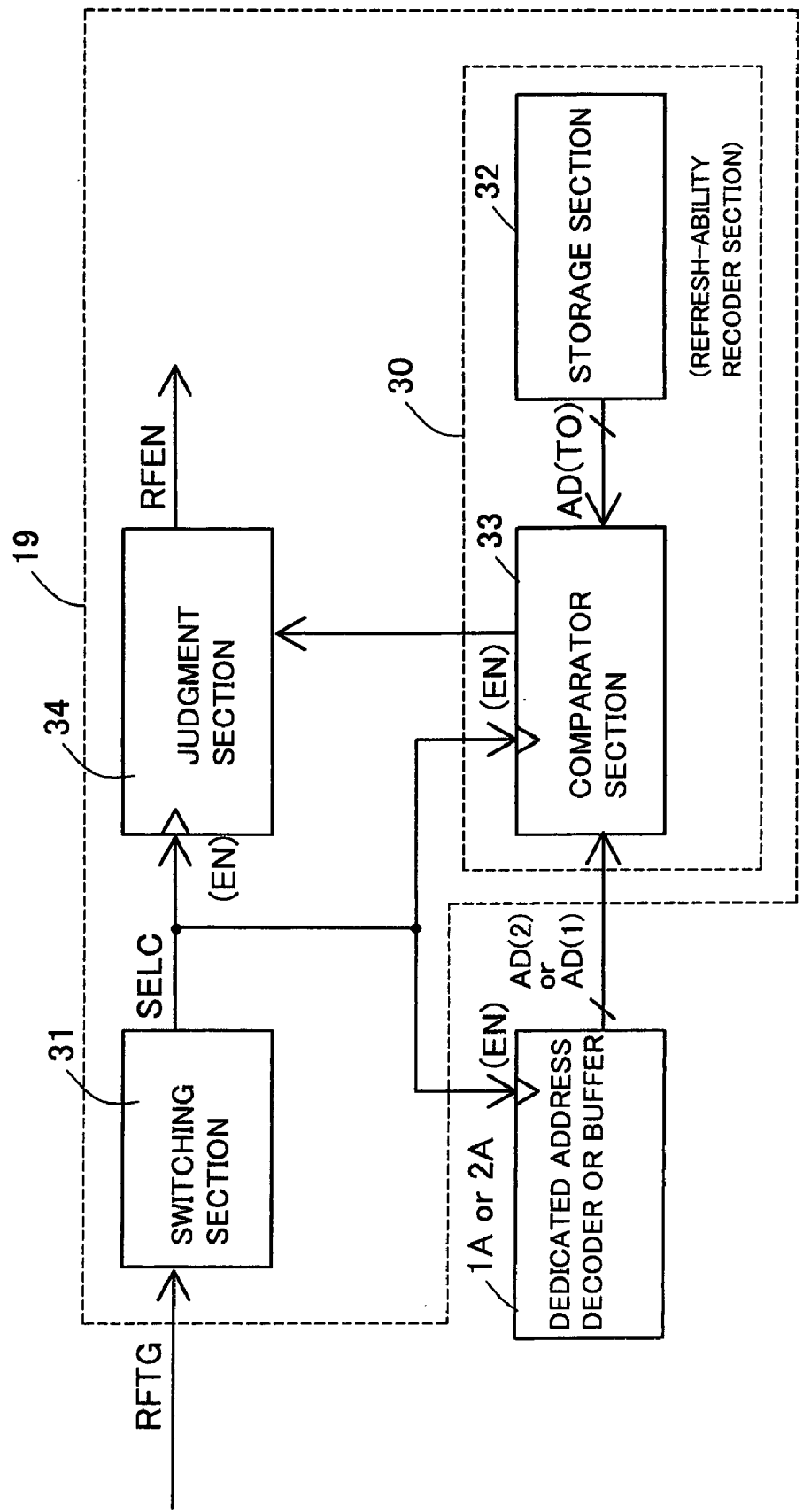
FIG. 12 is a circuit block diagram showing a refresh-thinning-out control circuit (third embodiment)

As a third embodiment, a circuit block diagram of a refresh-thinning-out control circuit is shown in FIG. 12. A refresh trigger signal RFTG is inputted to its corresponding switching section 31 in a refresh-thinning-out controller section 19. The switching section 31 outputs a switching control signal SELC for performing switching between activity and inactivity of refresh-thinning-out control according to the refresh trigger signal RFTG. The switching control signal SELC is inputted to a comparator section 33 and a judgment section 34 and serves so as to control the activation of these circuits. The switching control signal SELC is inputted even to a dedicated address decoder 1A or a buffer section 2A, where the activation is controlled similarly.

The comparator section 33 is inputted with pre-decode signal AD(1) or dedicated decode signal AD(2) intended for judgment as to the execution/non-execution of a refresh operation from the dedicated address decoder 1A or the buffer section 2A and performs address comparison between the signal and predetermined address AD(TO) including or corresponding to each word line connected to its corresponding memory cell having predetermined data-holding characteristics stored in a storage section 32. Here, it is needless to say that the predetermined address AD (TO) is decode signal having the same level as the pre-decode signal AD(1) or the dedicated decode signal AD(2). The storage section 32 and the comparator section 33 constitute a refresh-ability recorder section 30.

The result of comparison by the comparator section 33 is outputted to the judgment section 34 from which a refresh permission signal RFEN is outputted according to the state of setting of the switching control signal SELC.

In the refresh-thinning-out refresh control illustrated as the third embodiment as described above, the dedicated address decoder 1A or buffer section 2A, the comparator section 33 and the judgment section 34 are deactivated by the switching control signal SELC outputted from the switching section 31 where a refresh-thinning-out operation is not executed. It is therefore possible to reduce current consumption made due to unnecessary circuit operations.

Figure 13:
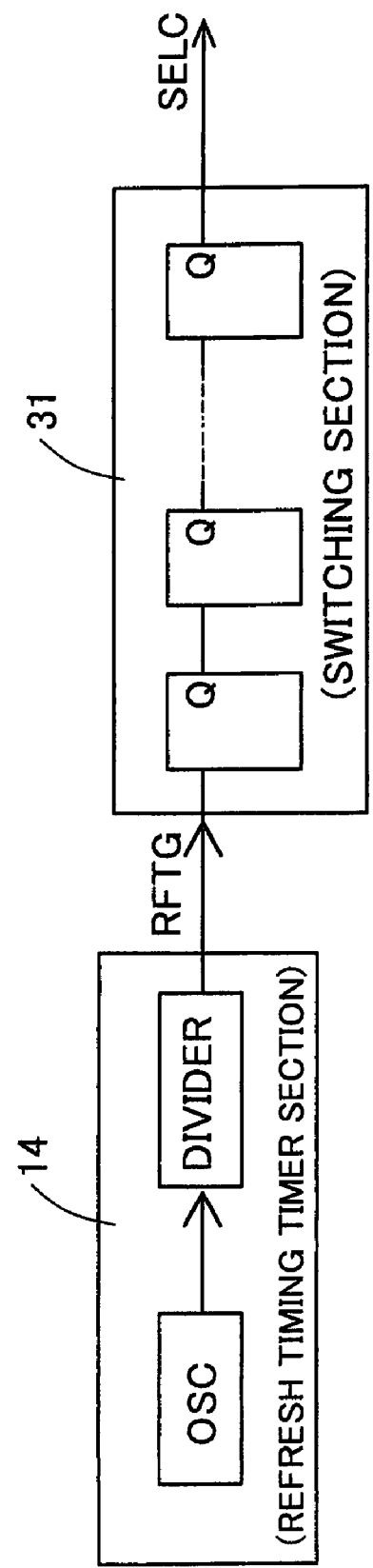
FIG. 13 is a circuit block diagram illustrating a switching section employed in the third embodiment.

FIG. 13 shows a specific example of the switching section 31 employed in the third embodiment. A refresh timing timer section 14 comprises an oscillator circuit and a divider. The refresh timing timer section 14 divides an oscillation signal produced from the oscillator circuit to output each refresh trigger signal RFTG. The switching section 31 has a counter made up of a predetermined number of flip-flops. The switching section 31 counts the number of occurrences of the refresh trigger signal RFTG to thereby measure or time a refresh cycle tREF.

Since word lines are sequentially selected every refresh trigger signals RFTG and refresh requests are made, a refresh cycle tREF can be timed if the outputs of the refresh trigger signals RFTG corresponding to the number of word lines to be refreshed, are counted. If the setting of execution of refresh-thinning-out control every 2 cycles of the refresh cycle tREF is taken, then the switching control signal SELC is switched for each timing of the refresh cycle tREF to thereby make it possible to perform switching between activity and inactivity of the refresh-thinning-out control.

Since the refresh cycle tREF can be timed by counting the number of the outputs of the refresh trigger signals RFTG, the processes such as the initialization of the refresh address Add(C) or the storage of the initial value, etc., which have been required for the method of making a circuit of the refresh address Add(C) to thereby time or measure the refresh cycle tREF, become unnecessary. The circuits for performing the processes such as the initialization or the storage of the initial value become unnecessary, and the simplification of the control circuit and a reduction in current consumption can be achieved.

Figure 14:
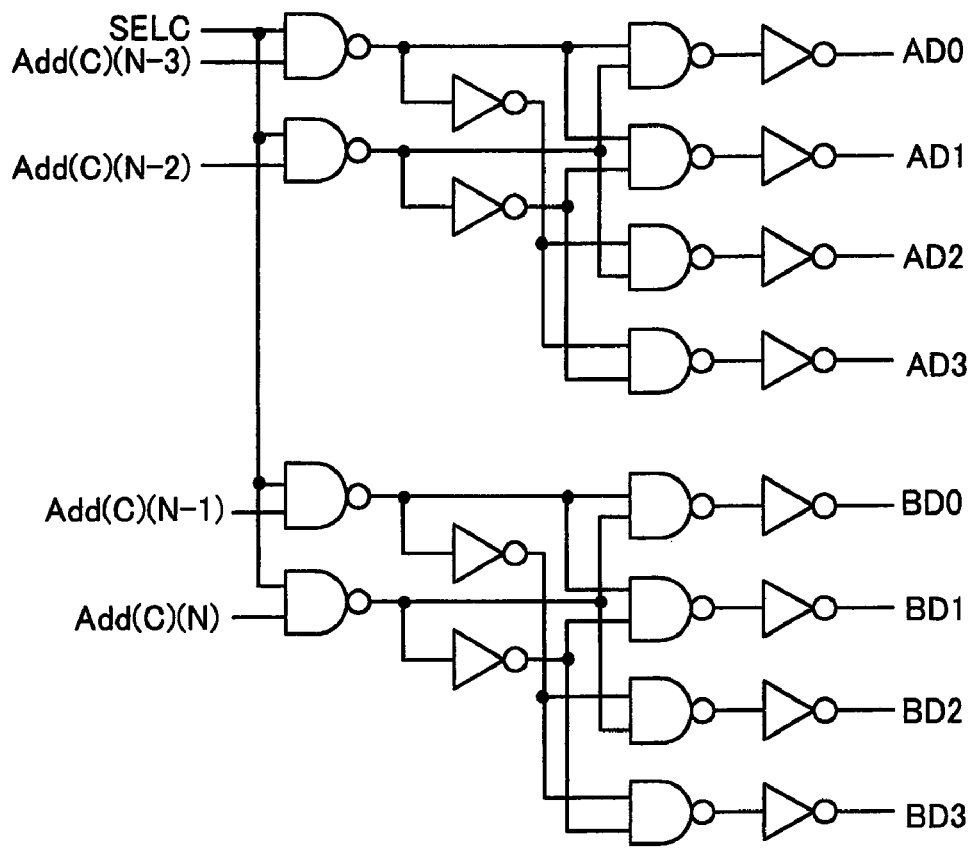
FIG. 14 is a circuit block diagram showing a dedicated address decoder employed in the third embodiment.

FIG. 14 shows a specific example of the dedicated address decoder 1A employed in the third embodiment. In the specific example of FIG. 14, high-order 4 bits of refresh address Add(C) are selected as units for judgment as to the execution/non-execution of a refresh operation, which bits are defined as high-order refresh addresses Add(C) (N−3) through (N). Here, N indicates the most significant bit. The high-order refresh addresses Add(C) (N−3) through (N) are inputted to their corresponding NAND logic gates together with a switching control signal SELC. Positive/negative complementary signals are produced from the outputs of the respective NAND logic gates and the outputs of ANDing of all the combinations every addresses are produced to thereby execute decoding. Decode signals AD0 through AD3 are respectively signals relative to combinations of (0, 0), (0, 1), (1, 0) and (1, 1) with respect to the refresh addresses Add(C) (N−3) and (N−2), whereas decode signals BD0 through BD3 are respectively signals for combinations of (0, 0), (0, 1), (1, 0) an (1, 1) with respect to the refresh addresses Add(C) (N−1) and (N). Incidentally, decode processing is activated when the switching control signal SELC is of a high logical level, whereas it is fixed to a predetermined output regardless of address values when it is of a low logical level, thus resulting in non-activation.

Figure 15:
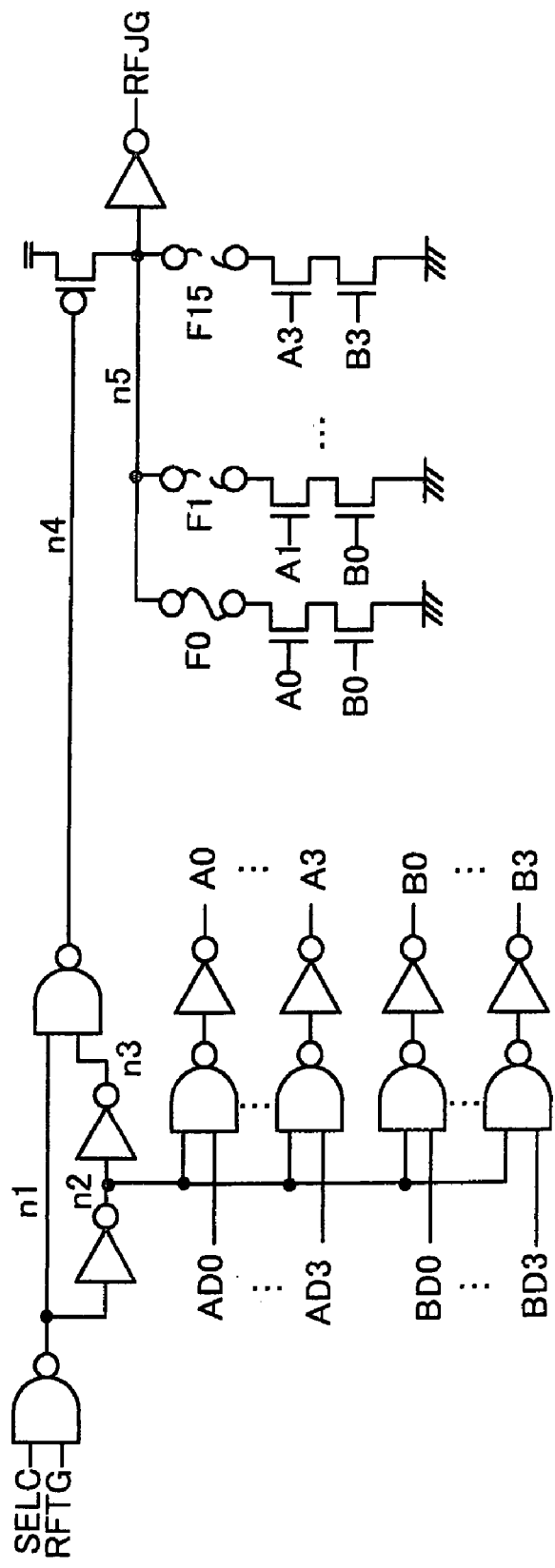
FIG. 15 is a circuit block diagram depicting a refresh-ability recorder section employed in the third embodiment.

FIG. 15 is a specific example of the refresh-ability recorder section 30 employed in the third embodiment. An output terminal n1 of a NAND logic gate to which a switching control signal SELC and a refresh trigger signal RFTG are inputted, is connected to an input terminal of series-connected inverter logic gates of two stages. Further, the output terminal n1 is connected to an input terminal of another NAND logic gate together with an output terminal n3 of the inverter logic gate corresponding to the second stage, and an output terminal n4 of the NAND logic gate is connected to its corresponding gate terminal of a PMOS transistor. One terminal of the PMOS transistor is connected to a power-supply voltage. The decode signals AD0 through AD3 and BD0 through BD3 decoded by the dedicated address decoder 1A are inputted to their corresponding NAND logic gates together with the output terminal n2 of the first-stage inverter gate and thereafter inverted by their corresponding inverter logic gates, whereby pulse decode signals A0 through A3 and B0 through B3 are outputted.

The pulse decode signals A0 through A3 and B0 through B3 are respectively combined together and inputted to their corresponding gate terminals of series-connected NMOS transistors of respective two stages in 16 combinations. One terminals of rows of the 16 pairs of NMOS transistors each having a two-stage configuration are connected to their corresponding ground voltages, whereas the other terminals thereof are connected to a drain terminal of the PMOS transistor at a terminal n5 through fuse elements F0 through F15. The terminal n5 is connected to its corresponding input terminal of an inverter logic gate, and a refresh judgment signal RFJG is outputted from an output terminal of the inverter logic gate.

In FIG. 15, the fuses (F0 through F15) are cut out with respect to the pulse decode signals inclusive of word lines connected with memory cells good in data-holding characteristics and capable of thinning-out refresh operations. A word line designated by the pulse decode signals (A0, B0) corresponding to a non-cutout fuse (fuse 0 (F0) in FIG. 15) includes memory cells each of which is poor in data-holding characteristics and must execute a refresh operation for each refresh cycle tREF.

Figure 16:
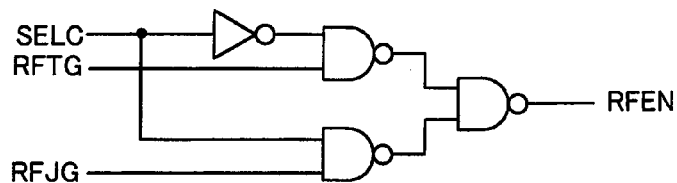
FIG. 16 is a circuit block diagram showing a first judgment section employed in the third embodiment.

FIG. 16 is a specific example of a first judgment section constituting the judgment section 34 employed in the third embodiment. The first judgment section is provided with respective NAND logic gates each inputted with a refresh judgment signal RFJG or a refresh trigger signal RFTG. A switching control signal SELC and its inverted signal are respectively inputted to other input terminals. Output terminals of the pair of NAND logic gates are connected to their corresponding input terminals of a NAND logic gate, and a refresh permission signal RFEN is outputted from its output terminal.

Figure 17:
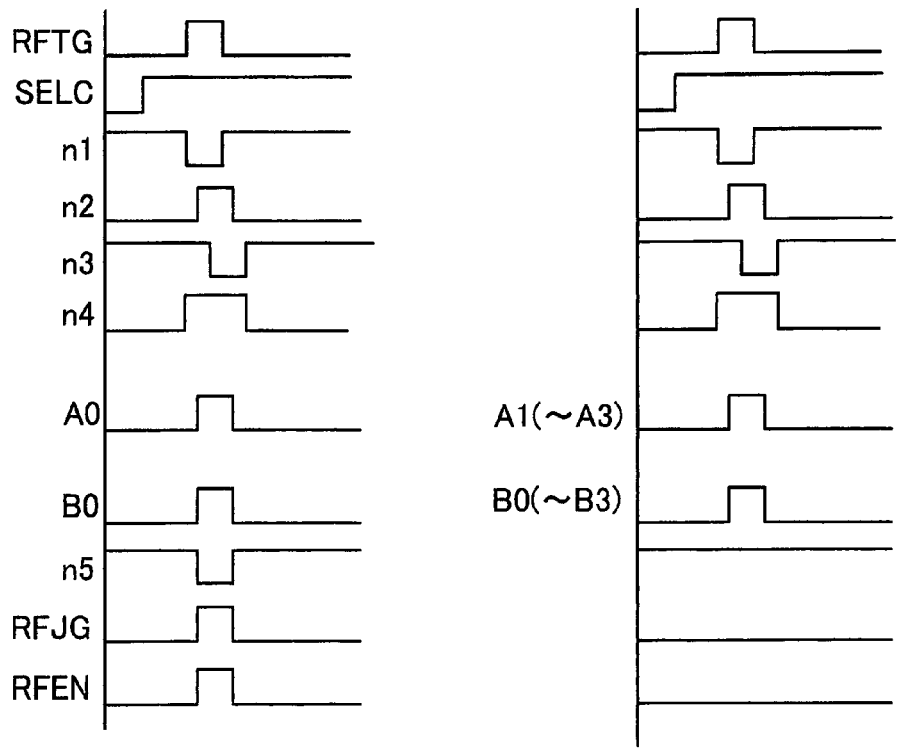
FIG. 17 is an operation waveform diagram illustrating operations of the refresh-ability recorder section and the first judgment section.

FIG. 17 shows operations waveforms for describing operations of the refresh-ability recorder section (FIG. 15) and the first judgment section (FIG. 16). In FIG. 17, (A) shows the selection of the pulse decode signals (A0, B0), and (B) indicates the selection of the pulse decode signals (A1, B0) through (A3, B3).

Operations common to the respective (A) and (B) will first be explained. When a pulse signal of a high logical level is inputted to the refresh trigger signal RFTG and a refresh request is issued in a state in which the switching control signal SELC is brought to a high logical level and refresh-thinning-out control is being activated, a logically-inverted pulse signal having a low logical level is outputted to the terminal n1 and further inverted and delayed, followed by output of a pulse signal of a high logical level at the terminal n2. Similarly, a delayed pulse signal having a low logical level is outputted to the terminal n3. Based on the pulse signals of the low logical levels at the terminals n1 and n3, a pulse signal of a high logical level, which has been expanded from the pulse at the terminal n1 to the pulse at the terminal n3, is outputted to the terminal n4. During this period, the PMOS transistor is turned off to stop the charging of the terminal n5 to the power-supply voltage.

In the case of (A), the pulse decode signals A0 and B0 produce a pulse signal having a high logical level, based on the pulse signal at the terminal n2. Thus, the NMOS transistor row to which the pulse decode signals A0 and B0 are inputted, is brought into conduction. Further, since the fuse 0 (F0) connected between the same row and the terminal n5 is not cut off, the terminal n5 is discharged to the ground voltage so as to reach a low logical level. Since the terminal n4 is thereafter transitioned to a low logical level, the PMOS transistor is brought into conduction again to charge the terminal n5 to a high logical level. As a result, a pulse signal of a low logical level is outputted at the terminal n5 and then inverted by the corresponding inverter logic gate, so that a pulse signal of a high logical level is outputted therefrom as a refresh permission signal RFEN.

In the case of (B), any combination of the pulse decode signals (A1, B0) through (A3, B3) outputs or produces a pulse signal of a high logical level, based on a pulse signal at the terminal n2. Thus, the corresponding NMOS transistor row inputted with any combination of the pulse decode signals (A1, B0) through (A3, B3) is brought into conduction. However, since all the fuses (F1 through F15) connected between the terminal n5 and each NMOS transistor row are cut off in the case of (B), a path extending from the terminal n5 to the ground voltage is not established and the voltage at the terminal n5 is maintained at the power-supply voltage. As a result, the voltage is inverted by the inverter logic gate and the resultant refresh permission signal RFEN is maintained at a low logical level.

While the specific examples shown in FIGS. 14 and 15 have respectively show the case in which the refresh address Add(C) (m) is set by the high-order 4 bits as seen from the most significant bit, the number of the high-order bits is not limited to it. Layout exclusively possessed areas of the fuses to be provided for the refresh-ability recorder section 30 and the effect of reducing current consumption by the refresh-thinning-out function owing to the collection-up of the refresh-thinning-out control every plural word lines have a tradeoff relationship. A suitable setting can be achieved while adjustments to both are being made.

FIG. 18 is a specific example of the second judgment section constituting the judgment section 34 employed in the third embodiment. The first judgment section (FIG. 16) performs a fuse cut-out process where word lines good in data-holding characteristics and capable of thinning out a refresh operation are included, whereas in the second judgment section, the setting of performing a process for cutting off each fuse where word lines relatively poor in data-holding characteristics and incapable of thinning out a refresh operation are included, is performed.

Here, a refresh cycle tREF is determined according to the ability of data-holding characteristics of each memory cell. Namely, there is a need to effect refresh on each memory cell relatively poor in data-holding characteristics in a shorter period of time. Since the refresh cycle tREF is set under rate-control to each memory cell poor in data-holding characteristics, a decision as to the execution/non-execution of a refresh operation is made to each memory cell relatively good in data-holding characteristics according to a refresh request signal, and the refresh operation may be effected thereon as needed. However, there is a need to effect the refresh operation on each memory cell relatively poor in data-holding characteristics for each refresh request signal.

The second judgment section includes a 3-input NAND logic gate as an alternative to the NAND logic gate inputted with the switching control signal SELC and the refresh judgment signal RFJG in the judgment section (FIG. 16). A switching control signal SELC, a delay signal obtained by delaying a refresh trigger signal RFTG outputted to a terminal n11 by a predetermined delay time τ, and a pulse signal of a low logical level, which is obtained by expanding a pulse signal of a high logical level of a refresh judgment signal RFJG outputted to a terminal n12 by a predetermined time interval, are inputted to the 3-input NAND logic gate.

FIG. 19 shows operation waveforms. In FIG. 19, (A) illustrates the selection of pulse decode signals (A0, B0), and (B) shows the selection of pulse decode signals (A1, B0) through (A3, B3).

When a pulse signal of a high logical level is inputted to the refresh trigger signal RFTG in a state in which the switching control signal SELC is of a high logical level as an operation common to (A) and (B), a delayed pulse signal having a high logical level is outputted to the terminal n11 after the predetermined delay time τ.

Since the fuse 0 (F0) is not cut out in the refresh-ability recorder section 30 (FIG. 15) in the case of (A), a pulse signal of a high logical level is outputted therefrom as the refresh judgment signal RFJG. In the second judgment section, this pulse signal is logically inverted and then expanded in pulse width, which in turn is outputted to the terminal n12 as a pulse signal of a low logical level. At this time, a predetermined delay time τ is set in such a manner that the pulse signal having the high logical level outputted to the terminal n11 is embedded in a period of the pulse signal at the terminal n12. Thus, any of the input terminals of the 3-inut NAND logic gate is inputted with the signal of the low logical level, so that the output terminal n13 is maintained at the high logical level. Since the output of other NAND logic gate is also maintained at a high logical level here, a refresh permission signal RFEN is maintained at a low logical level.

In the case of (B), the fuses (F1 through F15) are cut out in the refresh-ability recorder section 30 (FIG. 15) and a refresh judgment signal RFJG is maintained at a low logical level. Thus, the terminal n12 is maintained at a high logical level in the second judgment section. Thus, a pulse signal of a low logical level is outputted to the output terminal n13 of the 3-input NAND logic gate, based on a pulse signal of a high logical level at the terminal n11, and hence a refresh permission signal RFEN is outputted as a pulse signal of a high logical level.

According to the specific example of the third embodiment as described above, when the second judgment section is made effective, the logic of cutting-off of each fuse and the meaning of the refresh judgment signal RFJG are set in reversed form with respect to the case in which the first judgment section is made effective. Accordingly, the setting for using the first and second judgment sections by switching is effective. At the initial stage, the first judgment section is made effective and set to the logic of cutting off each fuse where each memory cell good in data-holding characteristics is included. When the memory cells good in data-holding characteristics increases due to factors in manufacturing, and the fuse group provided for the refresh-ability recorder section 30 cannot cope with it, the first judgment section is switched to the second judgment section. Thus, since each memory cell poor in data-holding characteristics is reversed to the logic of performing the fuse cutout, the number of fuse cutouts can be reduced. The number of the fuses provided for the refresh-ability recorder section 30 can be limited and the exclusively possessed area of the fuse group can be suppressed.

The provision of one switching fuse can cope with the switching between the first judgment section and the second judgment section. For example, the refresh permission signals RFEN outputted from the respective judgment sections are set so as to be supplied via their corresponding transfer gates. Since only either one of the transfer gates is brought into conduction, the control signals sent to the respective transfer gates have a complementary relationship. Reversing the logic relation by the switching fuse allows the switching between the judgment sections.

Predetermined addresses to be stored in the storage section 32 in the refresh-ability recorder section 30 are selected or switched according to the distribution of the data-holding characteristics included in each memory cell in the semiconductor memory device to thereby allow switching to judgment as to the execution/non-execution of a refresh operation. Therefore, the predetermined addresses to be stored in the storage section 32 can be switched to get fewer according to the distribution of the data-holding characteristics. The layout number of fuses or the like to be provided for the storage section 32 is compressed to make it possible to suppress an increase in the die size of the semiconductor memory device.

Since the number of the predetermined addresses to be stored is compressed, the procedure of executing storage processing of the predetermined addresses into the storage section 32 can be lightened. It is possible to shorten a processing time interval and reduce processing cost with it.

Incidentally, while a description has been made of the case in which the first judgment section is made effective at the initial stage upon the setting of the first/second judgment sections, the second judgment section may be made effective. It is further needless to say that while a description has been made of the case in which the switching between the first/ second judgment sections is performed by the corresponding fuse, memory means for storing the state of a RAM, a ROM, a register or the like other than the fuses may be used.

The first/second judgment sections may be switched according to characteristics varied according to use environments such as a use temperature, a power-supply voltage to be used, etc. in addition to switching made according to characteristic distributions measured upon tests such as a delivery inspection, etc. where they are switched according to the distribution of data-holding characteristics. If, in this case, situation-vs-setting memory means is set to a rewritable RAM or the like as an alternative to the fuses, then the setting of switching between the judgment sections can be changed according to variations in environment.

Figure 20:
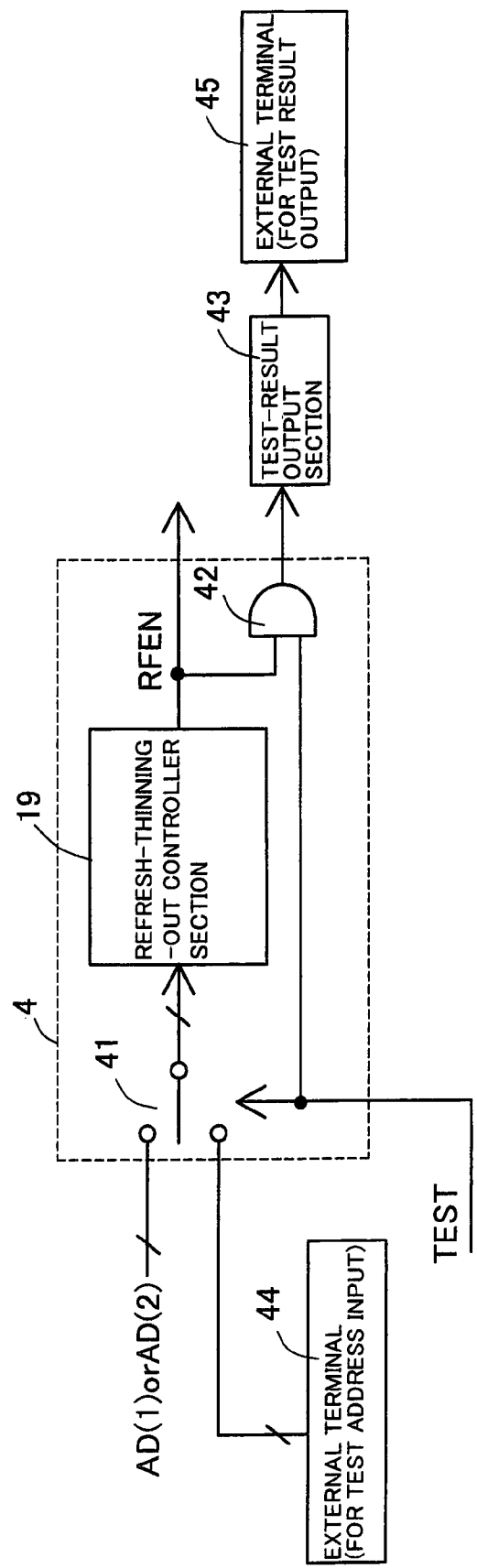
FIG. 20 is a circuit block diagram illustrating a refresh-thinning-out circuit equipped with a test facilitating function (fourth embodiment)

FIG. 20 shows a refresh-thinning-out control circuit 4 provided with a test facilitating function. In order to input a pre-decode signal AD(1) or a dedicated decode signal AD(2), or a testing address signal sent from an external terminal 44 for test address input, a switch section 41 switched by a test signal TEST is provided at an input portion of a refresh-thinning-out controller section 19. An AND logic gate 42 and a test-result output section 43 both used for outputting a refresh permission signal RFEN to an external terminal 45 for the output of a test result according to the test signal TEST are provided at an output portion of the refresh-thinning-out controller section 19.

In a normal or ordinary operating state, the test signal TEST is set to a low logical level, for example. The switch section 41 is connected to the pre-decode signal AD(1) or the dedicated decode signal AD(2), so that the corresponding address signal to make a decision as to the execution/non-execution of a refresh operation is inputted. Since the output of the AND logic gate 42 is fixed to a low logical level, the test result output section 43 can be maintained at an inactive state. Accordingly, the external terminal 44 for the test address input and the external terminal 45 for the test result output can be used as terminals other than for testing in this case.

In a test state, the test signal TEST is brought to a high logical level, for example. The switch section 41 is connected to the external terminal 44 for the test address input so that an externally-set address signal is inputted. Since a signal kept in phase with a refresh permission signal RFEN is outputted to the output of the AND logic gate 42, a test result can be outputted to the external terminal 45 for the test result output via the test result output section 43. In this case, the testing address can be freely inputted from the external terminal 44, and necessary addresses can be supplied promptly and accurately for testing without waiting for control of a built-in refresh address counter or the like. It is possible to provide the test facilitating function effective for application to a fail analysis and a characteristic analysis.

According to the fourth embodiment as described above, the result of judgment as to the execution/non-execution of the refresh operation by the refresh-thinning-out controller section 19 can be observed externally as needed. Therefore, it can be made available for the fail analysis, characteristic analysis and the like of the semiconductor memory device, and a characteristic test can be executed efficiently.

Refresh-thinning-out control in a redundant region will be described in FIGS. 21 through 23 as a fifth embodiment.

Figure 21:
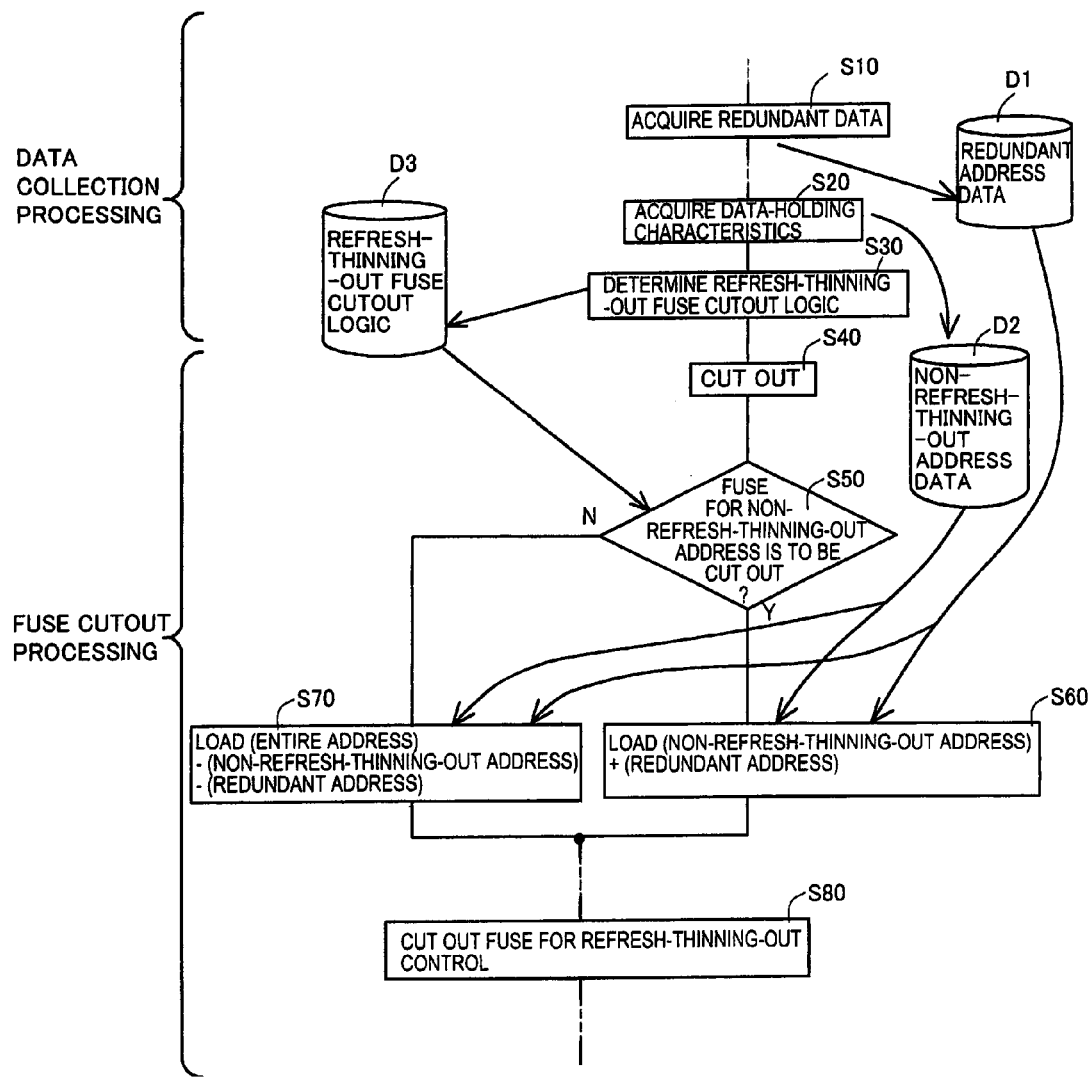
FIG. 21 is a flow chart showing a first specific example of refresh-thinning-out control circuit (fifth embodiment) in a redundant region.

FIG. 21 is a first specific example. The present drawing is a flowchart for describing a process for cutting off even each fuse for indicating a redundant region through the use of redundant setting data upon cutting off of each fuse for storing each address for refresh-thinning-out control.

A data collecting process stage will first be described. In Step (hereinafter abbreviated as "S") 10, redundant data is acquired. Address data related to each of fail or defective memory cells defective in operating characteristics is acquired. These memory cells in an address region are intended for the use of a redundant region. The acquired data is stored as redundant address data (D1). Further, data-holding characteristics stored in the corresponding memory cell are acquired (S20). Data for determining a region for performing thinning-out control on a refresh operation is acquired according to good/bad states of the data-holding characteristics. Of the acquired data, an address relatively poor in data-holding characteristics and unable to be intended for refresh-thinning-out is stored as non-refresh-thinning-out address data (D2). Next, refresh-thinning-out fuse cutout logic is determined or established according to the distribution of the data-holding characteristics (S30). This is a process for setting fuse cutout to an address poor in data-holding characteristics where memory cells good in data-holding characteristics exist in large numbers, and setting fuse cutout to an address good in data-holding characteristics where memory cells good in data-holding characteristics are few in reverse. The result of logic determination is stored as refresh-thinning-out fuse cutout logic data (D3).

A fuse cutting-out process stage will next be explained. When fuse cutout is effected on a non-refresh-thinning-out address, based on the refresh-thinning-out fuse cutout logic data (D3) (S50: YES), data obtained by adding the redundant address data (D1) and the non-refresh-thinning-out address data (D2) is loaded as cutout data (S60). When the fuse cutout is not effected on the non-refresh-thinning-out address (S50: NO), an address obtained by subtracting the redundant address data (D1) and the non-refresh-thinning-out address data (D2) from all addresses is loaded as cutout data (S70). The fuse cutout for the refresh-thinning-out control is performed based on the loaded data.

According to the first specific example of the fifth embodiment, which has been described above, the non-refresh-thinning-out address poor in data-holding characteristics and free of the execution of the refresh-thinning-out control, and the redundant address are added together to cut the corresponding fuse in S60. In S70, the redundant address and the non-refresh-thinning-out address are subtracted from all the addresses to thereby perform the fuse cutout. Thus, the setting free of the execution of thinning-out control can be taken in the redundant region.

Since judgment as to whether the refresh operation is executable, is not made to each redundant memory cell subjected to redundancy setting, the test of measuring data-holding characteristics for the redundant memory cell and selecting a predetermined address for performing refresh-thinning-out control, of redundant addresses as needed becomes unnecessary. An increase in test time can be suppressed.

Since the data subjected to redundancy setting is utilized as it is in the redundant region to thereby make it possible to cut out the corresponding refresh-thinning-out fuse, a control circuit or the like for avoiding the execution of the refresh-thinning-out control on the redundant region becomes unnecessary.

Figure 22:
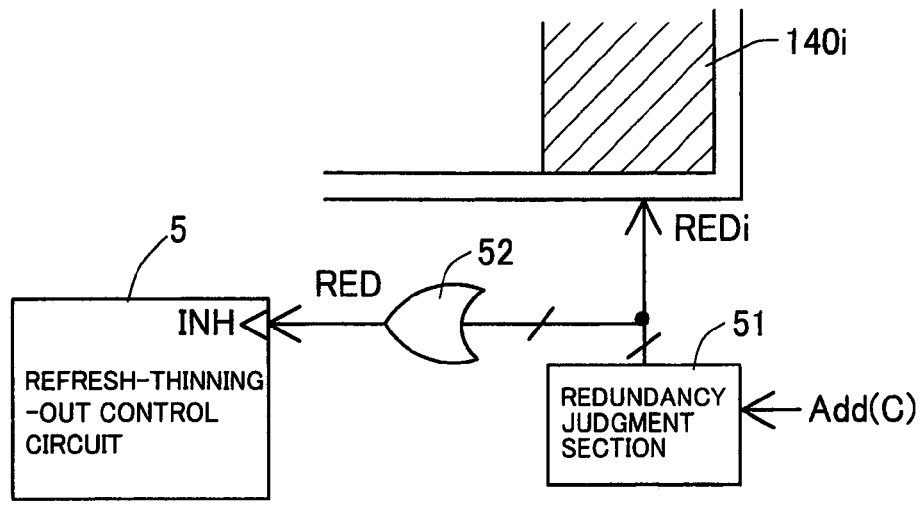
FIG. 22 is a circuit block diagram illustrating a second specific example of the refresh-thinning-out control circuit (fifth embodiment) in the redundant region.

FIG. 22 is a second specific example. The present drawing is a circuit block diagram showing a configuration for making a decision as to whether redundancy setting is made to a refresh address Add(C) and then controlling a refresh-thinning-out control.

When the refresh address Add(C) is produced, a redundancy judgment section 51 determines whether redundancy setting is made to each redundant region 140*i*. If the redundancy setting is found to be made thereto, then the redundancy judgment section 51 outputs a redundant signal REDi and obtains access to the corresponding redundant region 140*i*. Since the redundant region 140*i* is generally divided into a plurality of blocks according to the configuration of the semiconductor memory device, the redundant signal REDi is also produced for each divided redundant region 140*i*.

These redundant signals REDi are ORed by an OR logic gate 52 and inputted to a deactivating terminal INH of a refresh-thinning-out control circuit 5 as a redundancy setting signal RED. When the redundancy setting signal RED is inputted to the refresh-thinning-out control circuit 5, the refresh-thinning-out control circuit 5 is brought into a non-activation or deactivation state to thereby make it possible to prohibit thinning-out control. Thus, the setting of avoiding the execution of the thinning-out control in the redundant region can be performed.

According to the second specific example of the fifth embodiment, which has been described above, the prohibition of the thinning-out control in the redundant region can be performed by the corresponding redundant signal REDi outputted from the redundancy judgment section 51 and for accessing the corresponding redundant region 140*i*. Accordingly, there is no need to effect a specific process on the refresh-thinning-out control by use of redundancy setting data upon a characteristic test, and a test time can hence be shortened.

Figure 23:
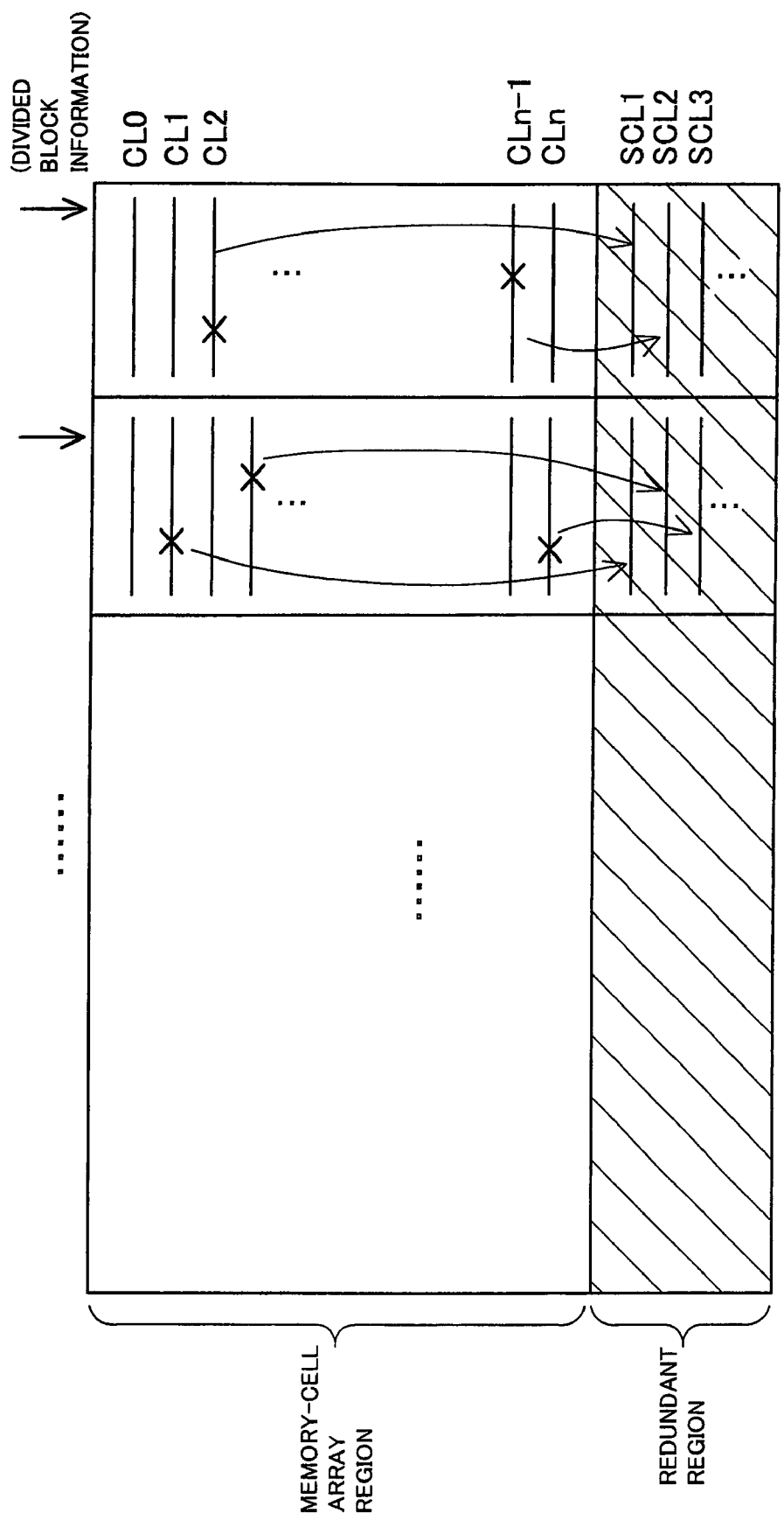
FIG. 23 is a layout conceptual diagram depicting column redundant configurations divided into blocks as viewed in a row address direction.

FIG. 23 is a layout conceptual diagram showing column redundancy. Configurations of the column redundancy are set in units divided into blocks in a row address direction. If such setting is taken, then refresh-thinning-out control can be prohibited in predetermined block units subjected to column redundancy. While complicated processes such as the measurement of data-holding characteristics in column redundant regions, etc. are being avoided and the setting of avoiding the execution of the refresh-thinning-out control in the column redundant regions is being made, the regions can be limited to regions divided into blocks. Therefore, a reduction in current consumption by the refresh-thinning-out control can be achieved in regions not subjected to column redundancy setting, and the avoidance of a complicated process in redundancy setting and a reduction in current consumption by refresh-thinning-out can be rendered compatible with each other upon column redundancy.

Incidentally, the present invention is not limited to the embodiments referred to above. It is needless to say that various improvements and modifications can be made thereto within the scope not departing from the substance of the present invention.

While the first through fifth embodiments have been described individually in the present embodiment, for example, it is needless to say that these configurations or methods can be combined suitably.

According to the present invention, there can be provided a semiconductor memory device which is capable of achieving a further reduction in current consumption insufficient for the conventional semiconductor memory device and is free of incurring of an operational increase in delay even if applied to a pseudo SRAM or the like having high compatibility and which is capable of realizing a suitable refresh-thinning-out function to thereby reduce current consumption in a standby state, and a refresh control method of the semiconductor memory device.

What is claimed is:

1. A semiconductor memory device for sequentially selecting target word lines according to refreshing request signals to thereby perform refresh operations, comprising:
    a storage section for storing an address, each address related to each word line which is connected with at least one of memory cells having first data-holding characteristics or second data-holding characteristics; and
    a storage switching section for switching the addresses to be stored in the storage section between first addresses related to word lines each of which is connected with the memory cells each having the first data-holding characteristics and second addresses related to word lines each of which is connected with the memory cells each having the second data-holding characteristics, according to a distribution of data-holding characteristics included in memory cells;
    wherein a frequency of execution of the refresh operation is judged based on the address to be stored in the storage section by the switching of the storage switching section,
    wherein the first address is stored in the storage section when a number of memory cells corresponding to the first address is smaller than a number of the memory cells corresponding to the second address.

2. The semiconductor memory device according to claim 1, wherein the first data-holding characteristics are data-holding characteristics same as or better than predetermined data-holding characteristics, and the second data-holding characteristics are data-holding characteristics same as or poorer than predetermined data-holding characteristics.

3. The semiconductor memory device according to claim 1, wherein the second data-holding characteristics are data-holding characteristics same as or better than predetermined data-holding characteristics, and the first data-holding characteristics are data-holding characteristics same as or poorer than predetermined data-holding characteristics.

* * * * *